US010051370B2

(12) United States Patent
Kim et al.

(10) Patent No.: US 10,051,370 B2
(45) Date of Patent: Aug. 14, 2018

(54) METHOD FOR OUTPUTTING AUDIO SIGNAL AND ELECTRONIC DEVICE SUPPORTING THE SAME

(71) Applicant: Samsung Electronics Co., Ltd., Gyeonggi-do (KR)

(72) Inventors: Taiyong Kim, Seoul (KR); Dongeon Kim, Gyeonggi-do (KR); Seungsoo Nam, Gyeonggi-do (KR); Juhee Jang, Gyeonggi-do (KR); Jeok Lee, Gyeonggi-do (KR); Jaehyun Kim, Gyeonggi-do (KR); Hochul Hwang, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/380,529

(22) Filed: Dec. 15, 2016

(65) Prior Publication Data

US 2017/0201829 A1 Jul. 13, 2017

(30) Foreign Application Priority Data

Jan. 8, 2016 (KR) ........................ 10-2016-0002697

(51) Int. Cl.
*H03G 5/00* (2006.01)
*H04R 3/14* (2006.01)
*H04R 3/04* (2006.01)

(52) U.S. Cl.
CPC ................. *H04R 3/14* (2013.01); *H04R 3/04* (2013.01); *H04R 2430/03* (2013.01)

(58) Field of Classification Search
CPC ......... H04R 2430/03; H04R 3/04; H04R 3/14
USPC ......... 381/17, 28, 71.1, 79, 80, 94.1, 98, 99, 381/100, 102, 103, 106, 111
See application file for complete search history.

(56) References Cited

U.S. PATENT DOCUMENTS

| | | | | |
|---|---|---|---|---|
| 5,361,381 | A | 11/1994 | Short | |
| 7,676,047 | B2 | 3/2010 | Aylward et al. | |
| 2008/0037794 | A1* | 2/2008 | Sugawara | H04R 5/023 381/1 |
| 2015/0229286 | A1* | 8/2015 | Asada | H03G 9/025 381/98 |

* cited by examiner

*Primary Examiner* — Vivian Chin
*Assistant Examiner* — Friedrich W Fahnert
(74) *Attorney, Agent, or Firm* — The Farrell Law Firm, P.C.

(57) ABSTRACT

A method and an electronic device for outputting an audio signal in the electronic device is provided. The electronic device includes a first speaker, a second speaker, and an audio processor that creates, from an audio signal, a first frequency audio signal corresponding to a first frequency band by using a low pass filter, synthesizes the created first frequency audio signal and the audio signal to create a synthetic audio signal, creates, from the synthetic audio signal, a second frequency audio signal corresponding to a second frequency band by using a high pass filter, outputs the created second frequency audio signal through the first speaker, and outputs the created synthetic audio signal through the second speaker.

14 Claims, 23 Drawing Sheets

METHOD FOR OUTPUTTING AUDIO SIGNAL AND ELECTRONIC DEVICE SUPPORTING THE SAME

PRIORITY

This application claims priority under 35 U.S.C. § 119(a) to Korean Patent Application No. 10-2016-0002697, filed in the Korean Intellectual Property Office on Jan. 8, 2016, the entire content of which is incorporated herein by reference.

BACKGROUND

1. Field of the Disclosure

The present disclosure relates generally to a method for outputting audio signals and an electronic device for supporting the same. In particular, the present disclosure relates to a method and an electronic device for adjusting an audio signal by a filter and outputting the adjusted audio signal.

2. Description of the Related Art

Audio data is reproduced by means of a multimedia player to then be output through a speaker. A faithful output of the original sound depends on the performance of the speaker and the characteristics of an audio processing unit of the player. Various techniques have been developed in order to faithfully reproduce the original sound.

With recent developments in technology, the audio processing unit may obtain the original sound by using a loudness equalization process that strengthens a low level signal to compensate for the non-linear characteristics of human ears. Another audio processing unit may generate harmonic waves by forming an absolute value by means of the rectifier arrangement. The audio processing unit may process the audio data based on the generated harmonic waves.

If audio data is input into two channels, the audio data may be output to speakers that correspond to the two input channels, respectively. Accordingly, there may be limitations on the increase in the low-band performance of the audio data.

SUMMARY

The present disclosure has been made to address at least the above-mentioned problems and/or disadvantages and to provide at least the advantages described below.

Accordingly, an aspect of the present disclosure is to improve the low-band performance of audio data by synthesizing the low band signals of the audio data for each channel.

Accordingly, another aspect of the present disclosure is to enhance the performance of audio data output by connecting a high pass filter (HPF) and a speaker and by separating frequency bands.

In accordance with an aspect of the present disclosure an electronic device is provided. The electronic device includes a first speaker, a second speaker, and an audio processor that creates, from an audio signal, a first frequency audio signal corresponding to a first frequency band by using a low pass filter, synthesizes the created first frequency audio signal and the audio signal to create a synthetic audio signal, creates, from the synthetic audio signal, a second frequency audio signal corresponding to a second frequency band by using a high pass filter, outputs the created second frequency audio signal through the first speaker, and outputs the created synthetic audio signal through the second speaker.

In accordance with another aspect of the present disclosure, a device is provided. The device includes a first speaker that outputs an audio signal of a first frequency band, a second speaker that outputs the audio signal, and a processor that synthesizes at least some of a first audio signal of a second frequency band corresponding to a first channel of the audio signal and a second audio signal corresponding to a second channel of the audio signal to create a third audio signal, outputs, through the second speaker, the third audio signal, and outputs, through the first speaker, a fourth audio signal corresponding to the first frequency band among the third audio signal by using a filter that passes the first frequency band.

In accordance with another aspect of the present disclosure, a method for outputting an audio signal in an electronic device is provided. The method includes creating, from an audio signal, a first frequency audio signal corresponding to a first frequency band by using a low pass filter, synthesizing the created first frequency audio signal and the audio signal to create a synthetic audio signal, creating, from the synthetic audio signal, a second frequency audio signal corresponding to a second frequency band by using a high pass filter, outputting the created second frequency audio signal through a first speaker, and outputting the created synthetic audio signal through a second speaker.

BRIEF DESCRIPTION OF THE DRAWINGS

The above and other objects, features, and advantages of the present disclosure will be more apparent from the following detailed description taken in conjunction with the accompanying drawings, in which.

DETAILED DESCRIPTION OF EMBODIMENTS OF THE PRESENT DISCLOSURE

Figure 1:
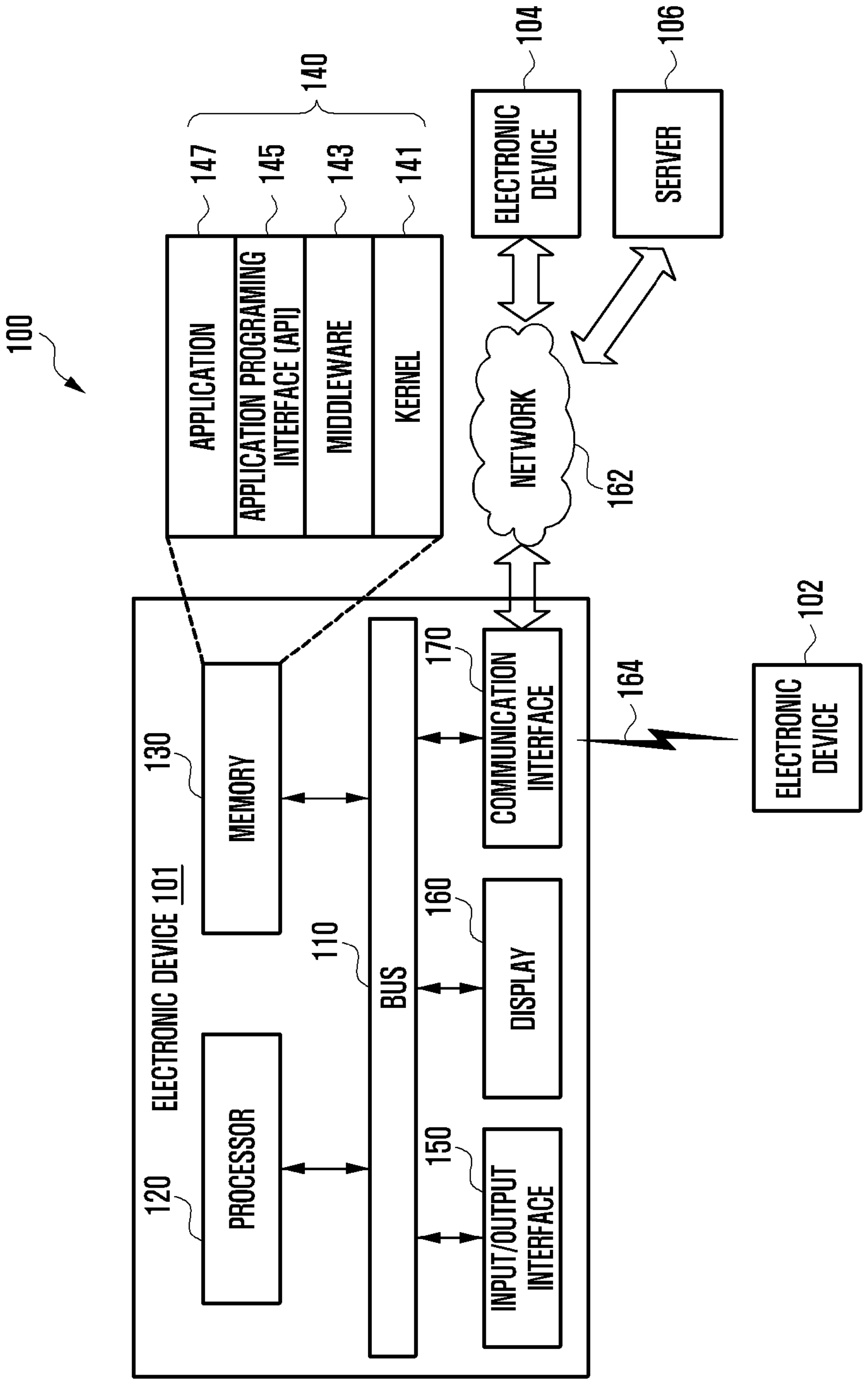
FIG. 1 is a block diagram of a network environment, according to an embodiment of the present disclosure.

The following description is made with reference to the accompanying drawings, in which like reference numerals are used to refer to like elements. Hereinafter, various embodiments of the present disclosure are provided to assist in a comprehensive understanding of the technical details of the present disclosure. Accordingly, the description includes various specific details to assist in that understanding, but the embodiments described herein are to be regarded as merely examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to their dictionary meanings, but, are merely used to enable a clear and consistent understanding of the present disclosure. Accordingly, it should be apparent to those skilled in the art that the following description of various embodiments of the present disclosure is provided for illustration purposes only and not for the purpose of limiting the present disclosure, which is defined by the appended claims and their equivalents.

It is to be understood that the singular forms “a,” “an,” and “the” include plural referents unless the context clearly indicates otherwise. Thus, for example, reference to “a component surface” includes reference to one or more of such surfaces.

In this disclosure, the expressions “A or B” or “at least one of A and/or B” may include A, may include B, or may include both A and B. Expressions including ordinal numbers, such as “first” and “second,” etc., may modify various elements. However, the above expressions do not limit the sequence and/or importance of the elements and are used merely for the purpose of distinguishing an element from the other elements. When an element (e.g., a first element) is referred to as being “connected” to or “accessed” by another element (e.g., a second element), it should be understood that the first element is directly connected to or accessed by the second element or is connected to are accessed through another element (e.g., a third element). In this disclosure, the expression “configured to” may be used, depending on situations, interchangeably with “adapted to”, “having the ability to”, “modified to”, “made to”, “capable of”, or “designed to”. In some situations, the expression “device configured to” may mean that the device may operate with other devices or other components. For example, the expression “processor configured to perform A, B and C” may refer to a dedicated processor (e.g., an embedded processor) for performing the above operations, or a general-purpose processor (e.g., central processing unit (CPU) or an application processor (AP)) capable of performing the above operations by executing one or more software programs stored in a memory device.

An electronic device according to various embodiments of this disclosure may include at least one of a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer 3 (MP3) player, a medical device, a camera, and a wearable device. For example, a wearable device may include at least one of an accessory type (e.g., a watch, a ring, a bracelet, an anklet, a necklace, an electronic accessory, eyeglasses, contact lenses, or a head-mounted device (HMD)), a textile or cloth assembled type (e.g., electronic clothing), a body attached type (e.g., a skin pad or tattoo), and a body transplant circuit.

In some embodiments, an electronic device may include at least one of a television (TV), a digital versatile disc (DVD) player, an audio device, a refrigerator, an air-conditioner, a vacuum cleaner, an oven, a microwave, a washing machine, an air cleaner, a set-top box, a home automation control panel, a security control panel, a media box (e.g., Samsung HomeSync™, Apple TV™, or Google TV™), a game console (e.g., Xbox™, PlayStation™), an electronic dictionary, an electronic key, a camcorder, and an electronic frame.

In various embodiments of the present disclosure, an electronic device may include at least one of various medical devices (e.g., a magnetic resonance angiography (MRA) device, a magnetic resonance imaging (MRI) device, a computed tomography (CT) device, a scanning machine, an ultrasonic wave device, etc.), a navigation device, a global navigation satellite system (GNSS), an event data recorder (EDR), a flight data recorder (FDR), a vehicle infotainment device, an electronic equipment for a ship (e.g., navigation equipment for a ship, gyrocompass, etc.), an avionics device, a security device, a head unit or device for a vehicle, an industrial or home robot, a drone, an automated teller machine (ATM), a point of sales (POS) device, and various Internet of things (IoT) devices (e.g., a lamp, various sensors, a sprinkler, a fire alarm, a thermostat, a street light, a toaster, athletic equipment, a hot water tank, a heater, a boiler, etc.).

According to a certain embodiment, an electronic device may include at least one of furniture, a portion of a building/structure or car, an electronic board, an electronic signature receiving device, a projector, and various measuring meters (e.g., a water meter, an electric meter, a gas meter, a wave meter, etc.).

In various embodiments, an electronic device may be flexible or a combination of two or more of the aforementioned devices. An electronic device according to various embodiments of this disclosure is not limited to the aforementioned devices. In this disclosure, the term user may refer to a person who uses an electronic device, or a machine (e.g., an artificial intelligence device) which uses an electronic device.

FIG. 1 is a block diagram of a network environment, according to an embodiment of the present disclosure.

Referring to FIG. 1, a network environment 100 includes an electronic device 101 is provided. The electronic device 101 may include, but is not limited to, a bus 110, a processor 120, a memory 130, an input/output interface 150, a display 160, and a communication interface 170.

The bus 110 is a circuit designed for connecting the above-discussed elements and communicating data (e.g., a control message) between such elements.

The processor 120 may receive commands from the other elements (e.g., the memory 130, the input/output interface 150, the display 160, or the communication interface 170, etc.) through the bus 110, interpret the received commands, and perform the arithmetic or data processing based on the interpreted commands.

The memory 130 may store therein commands or data received from or created at the processor 120 or other elements (e.g., the input/output interface 150, the display 160, or the communication interface 170, etc.). The memory 130 may include programming modules 140 such as a kernel 141, a middleware 143, an application programming interface (API) 145, and an application 147. Each of the programming modules may be composed of software, firmware, hardware, and any combination thereof.

The kernel 141 may control or manage system resources (e.g., the bus 110, the processor 120, the memory 130, etc.) used to execute operations or functions implemented by other programming modules (e.g., the middleware 143, the API 145, and the application 147). Also, the kernel 141 may provide an interface capable of accessing and controlling or managing the individual elements of the electronic device 101 by using the middleware 143, the API 145, or the applications 147.

The middleware 143 may serve as an intermediary between the API 145 or the application 147 and the kernel 141 in such a manner that the API 145 or the application 147 communicates with the kernel 141 and exchanges data therewith. Also, in relation to work requests received from one or more applications 147, the middleware 143 may perform load balancing of the work requests by using a method of assigning a priority, in which system resources (e.g., the bus 110, the processor 120, the memory 130, etc.) of the electronic device 101 can be used, to at least one of the one or more applications 147.

The API 145 is an interface through which the applications 147 are capable of controlling a function provided by the kernel 141 or the middleware 143, and may include, for example, at least one interface or function for file control, window control, image processing, character control, or the like.

The input/output interface 150 may deliver commands or data, entered by a user through an input/output unit or device (e.g., a sensor, a keyboard, or a touch screen), to the processor 120, the memory 130, or the communication interface 170 via the bus 110.

The display module 160 may include, for example, a liquid crystal display (LCD), a light emitting diode (LED) display, an organic LED (OLED) display, a micro electro mechanical system (MEMS) display, or an electronic paper display. The display 160 may display various types of contents (e.g., text, images, videos, icons, or symbols) to users. The display module 160 may include a touch screen, and may receive, for example, a touch, gesture, proximity, or hovering input by using an electronic pen or a part of the user's body.

The communication interface 170 may establish communication between the electronic device 101 and a first external electronic device 102, a second external electronic device 104, or a server 106. For example, the communication interface 170 may be connected with a network 162 through wired or wireless communication 164 and thereby communicate with the second external electronic device 104, or the server 106.

Wireless communication may use, as cellular communication protocol, at least one of long-term evolution (LTE), LTE advanced (LTE-A), code division multiple access (CDMA), wideband CDMA (WCDMA), universal mobile telecommunications system (UMTS), wireless broadband (WiBro), global system for mobile communications (GSM), and the like. A short-range communication may include, for example, at least one of Wi-Fi, Bluetooth (BT), near field communication (NFC), magnetic secure transmission or near field magnetic data stripe transmission (MST), and GNSS, and the like. The GNSS may include at least one of a global positioning system (GPS), a global navigation satellite system (GLONASS), a BeiDou navigation satellite system (BeiDou), and Galileo, the European global satellite-based navigation system). Hereinafter, the "GPS" may be interchangeably used with the "GNSS" in the present disclosure.

The wired communication may include, but is not limited to, at least one of universal serial bus (USB), high definition multimedia interface (HDMI), recommended standard 232 (RS-232), or plain old telephone service (POTS). The network 162 includes, as a telecommunications network, at least one of a computer network (e.g., local area network (LAN) or wide area network (WAN)), the Internet, and a telephone network.

The types of the first and second external electronic devices 102 and 104 may be the same as or different from the type of the electronic device 101. The server 106 may include a group of one or more servers. A portion or all of operations performed in the electronic device 101 may be performed in one or more of the external electronic devices 102 or 104 or the server 106. In the case where the electronic device 101 performs a certain function or service automatically or in response to a request, the electronic device 101 may request at least a portion of functions related to the function or service from the external electronic devices 102 or 104 or the server 106 instead of or in addition to performing the function or service for itself. The external electronic device 102 or 104 or the server 106 may perform the requested function or additional function, and may transfer a result of the performance to the electronic device 101. The electronic device 101 may additionally process the received result to provide the requested function or service. To this end, for example, a cloud computing technology, a distributed computing technology, or a client-server computing technology may be used.

Figure 2:
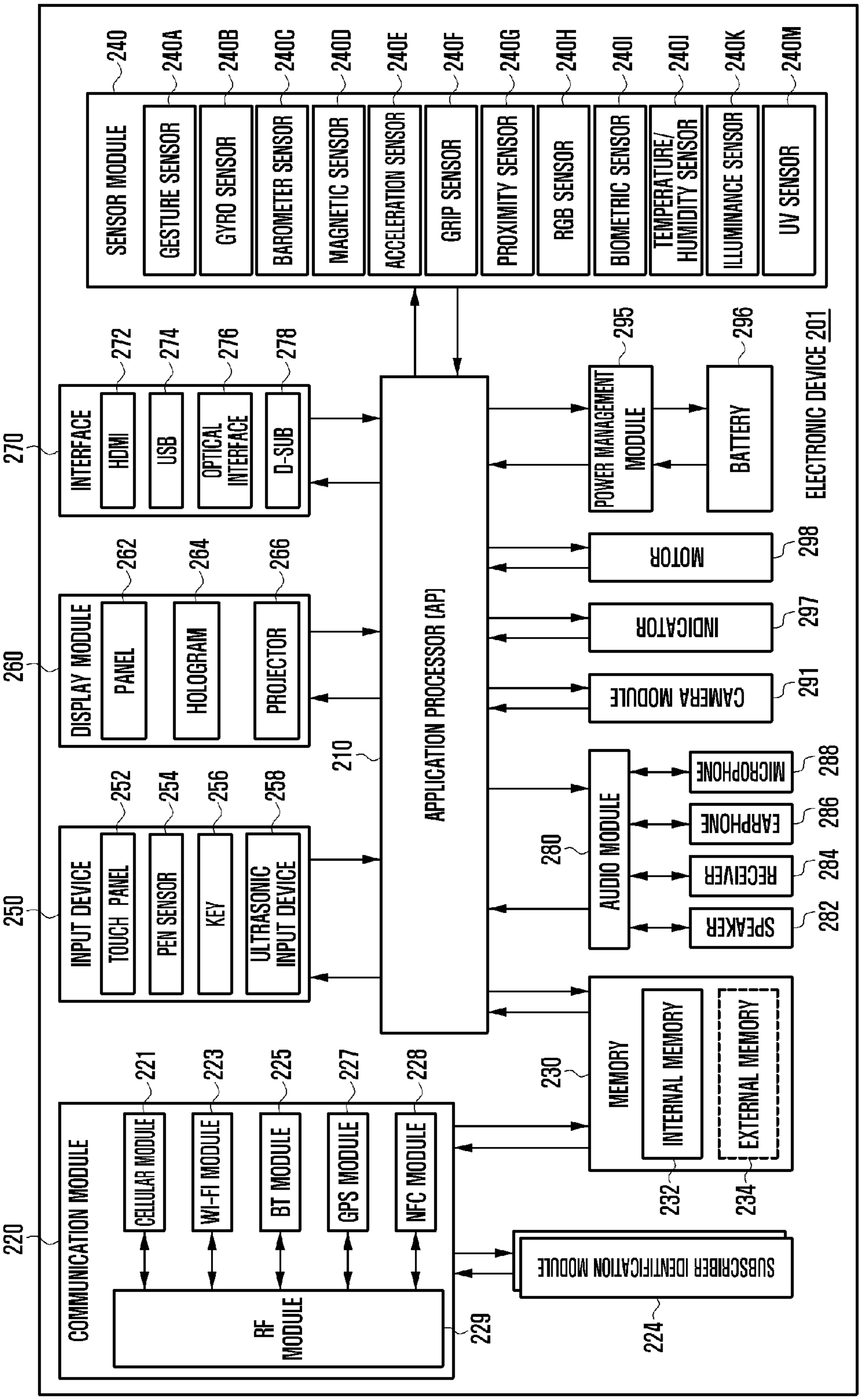
FIG. 2 is a block diagram of a configuration of an electronic device, according to an embodiment of the present disclosure.

FIG. 2 is a block diagram of a configuration of an electronic device, according to an embodiment of the present disclosure.

Referring to FIG. 2, an electronic device 201 is provided. The electronic device 201 may form the whole or part of the electronic device 101 shown in FIG. 1. The electronic device 201 may include at least one AP 210, a communication module 220, a subscriber identification module (SIM) 224, a memory 230, a sensor module 240, an input unit or input device 250, a display module 260, an interface 270, an audio module 280, a camera module 291, a power management module 295, a battery 296, an indicator 297, and a motor 298.

The processor 210 is drives an operating system or an application program to control a plurality of hardware or software components connected to the processor 210, processing various data, and performing operations. The processor 210 may be implemented as a system on chip (SoC). According to an embodiment, the processor 210 may further include a graphics processing unit (GPU) and/or an image signal processor.

The processor 210 may also include at least part of the other components of the electronic device 201, e.g., a cellular module 221. The processor 210 loads commands or data received from at least one of the other components (e.g., a non-volatile memory) on a volatile memory, processing the loaded commands or data. The processor 210 stores various data in a non-volatile memory.

The communication module 220 may perform a data communication with an external electronic device (e.g., the second external electronic device 104 or the server 106) connected to the electronic device 201 through the network 162. The communication module 220 may include therein a cellular module 221, a Wi-Fi module 223, a BT module 225, a GNSS or GPS module 227, an NFC module 228, and a radio frequency (RF) module 229.

The cellular module 221 provides a voice call, a video call, a short message service (SMS), an Internet service, etc., through a communication network, for example. The cellular module 221 may identify and authenticate an electronic device 201 in a communication network by using the SIM 224 (e.g., a SIM card). The cellular module 221 may perform at least part of the functions provided by the processor 210. The cellular module 221 may also include a communication processor (CP).

The Wi-Fi module 223, the BT module 225, the GNSS module 227, and the NFC module 228 are each capable of including a processor for processing data transmitted or received through the corresponding module.

At least part of the cellular module 221, Wi-Fi module 223, BT module 225, GNSS module 227, and NFC module 228 may be included in one integrated chip (IC) or one IC package.

The RF module 229 transmits and receives communication signals, e.g., RF signals. The RF module 229 may include a transceiver, a power amp module (PAM), a frequency filter, a low noise amplifier (LNA), an antenna, etc. At least one of the cellular module 221, the Wi-Fi module 223, the BT module 225, the GNSS module 227, and the NFC module 228 may transmit/receive of RF signals through a separate RF module.

The SIM 224 is a card including a SIM and/or an embedded SIM. The SIM 224 contains unique identification information, e.g., integrated circuit card identifier (ICCID), or subscriber information, e.g., international mobile subscriber identity (IMSI).

The memory 230 includes a built-in or internal memory 232 and/or an external memory 234. The built-in or internal memory 232 may include at least one of the following: a volatile memory, e.g., a dynamic random access memory (DRAM), a static RAM (SRAM), a synchronous dynamic RAM (SDRAM), etc.; and a non-volatile memory, e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., an NAND flash memory, an NOR flash memory, etc.), a hard drive, a solid state drive (SSD), etc.

The sensor module 240 may measure/detect a physical quantity or an operation state of the electronic device 201, and converts the measured or detected information into an electronic signal. The sensor module 240 may include at least one of a gesture sensor 240A, a gyro sensor 240B, a barometer sensor 240C, a magnetic sensor 240D, an acceleration sensor 240E, a grip sensor 240F, a proximity sensor 240G, a red, green and blue (RGB) sensor 240H, a biometric sensor 240I, a temperature/humidity sensor 240J, an illuminance sensor 240K, and an ultraviolet (UV) sensor 240M.

Additionally or alternatively, the sensor module 240 may further include one or more of an electronic nose (E-nose) sensor, an electromyography (EMG) sensor, an electroencephalogram (EEG) sensor, an electrocardiogram (ECG) sensor, an infrared (IR) sensor, an iris sensor and/or a fingerprint sensor.

The sensor module 240 may further include a control circuit for controlling one or more sensors included therein.

In various embodiments of the present disclosure, the electronic device 201 may include a processor, configured as part of the processor 210 or a separate component, for controlling the sensor module 240. In this case, while the processor 210 is operating in a sleep mode, the processor is capable of controlling the sensor module 240.

The input device 250 may include a touch panel 252, a (digital) pen sensor (digital pen or stylus) 254, a key 256, or an ultrasonic input device 258.

The touch panel 252 may be implemented with a capacitive touch system, a resistive touch system, an infrared touch system, and an ultrasonic touch system. The touch panel 252 may further include a control circuit. The touch panel 252 may also further include a tactile layer to provide a tactile response to the user.

The pen sensor 254 may be implemented with a part of the touch panel or with a separate recognition sheet.

The key 256 may include a physical button, an optical key, or a keypad.

The ultrasonic input unit 258 detects ultrasonic waves, created in an input tool, through a microphone 288, and identifies data corresponding to the detected ultrasonic waves.

The display 260 may include a panel 262, a hologram unit or device 264, or a projector 266.

The panel 262 may include the same or similar configurations as the display 106 shown in FIG. 1. The panel 262 may be implemented to be flexible, transparent, or wearable.

The panel 262 may also be incorporated into one module together with the touch panel 252.

The hologram unit 264 displays a stereoscopic image in the air by using light interference.

The projector 266 displays an image by projecting light onto a screen. The screen may be located inside or outside of the electronic device 201. The display 260 may further include a control circuit for controlling the panel 262, the hologram unit 264, or the projector 266.

The interface 270 may include an HDMI 272, a USB 274, an optical interface 276, or a D-subminiature (D-sub) 278. The interface 270 may be included in the communication interface 107 shown in FIG. 1. Additionally or alternatively, the interface 270 may include a mobile high-definition link (MHL) interface, an SD card/MMC interface, or an infrared data association (IrDA) standard interface.

The audio module 280 provides bidirectional conversion between a sound and an electronic signal. At least part of the components in the audio module 280 may be included in the input/output interface 145 shown in FIG. 1. The audio module 280 processes sound information input or output through a speaker 282, a receiver 284, earphones 286, and the microphone 288.

The camera module 291 captures both still and moving images. The camera module 291 may include one or more image sensors (e.g., a front image sensor or a rear image sensor), a lens, an image signal processor (ISP), a flash (e.g., an LED or xenon lamp), etc.

The power management module 295 manages power of the electronic device 201. The power management module 295 may include a power management IC (PMIC), a charger IC, or a battery gauge. The PMIC may employ wired charging and/or wireless charging methods. Examples of the wireless charging method are magnetic resonance charging, magnetic induction charging, and electromagnetic charging. To this end, the PMIC may further include an additional circuit for wireless charging, such as a coil loop, a resonance circuit, a rectifier, etc. The battery gauge is capable of measuring the residual capacity, charge in voltage, current, or temperature of the battery 296. The battery 296 may take the form of either a rechargeable battery or a solar battery.

The indicator 297 displays a specific status of the electronic device 201 or a part thereof (e.g., the processor 210), e.g., a boot-up status, a message status, a charging status, etc. The motor 298 converts an electrical signal into mechanical vibrations, such as, a vibration effect, a haptic effect, etc. The electronic device 201 may further include a processing unit (e.g., GPU) for supporting a mobile TV. The processing unit for supporting a mobile TV processes media data pursuant to standards, e.g., digital multimedia broadcasting (DMB), digital video broadcasting (DVB), or mediaFlo™, etc.

Each of the elements described in the present disclosure may be formed with one or more components, and the names of the corresponding elements may vary according to the type of the electronic device. In various embodiments, the electronic device may include at least one of the above described elements, may exclude some of the elements, or may further include other additional elements. Further, some of the elements of the electronic device according to various embodiments may be coupled to form a single entity while performing the same functions as those of the corresponding elements before the coupling.

Figure 3:
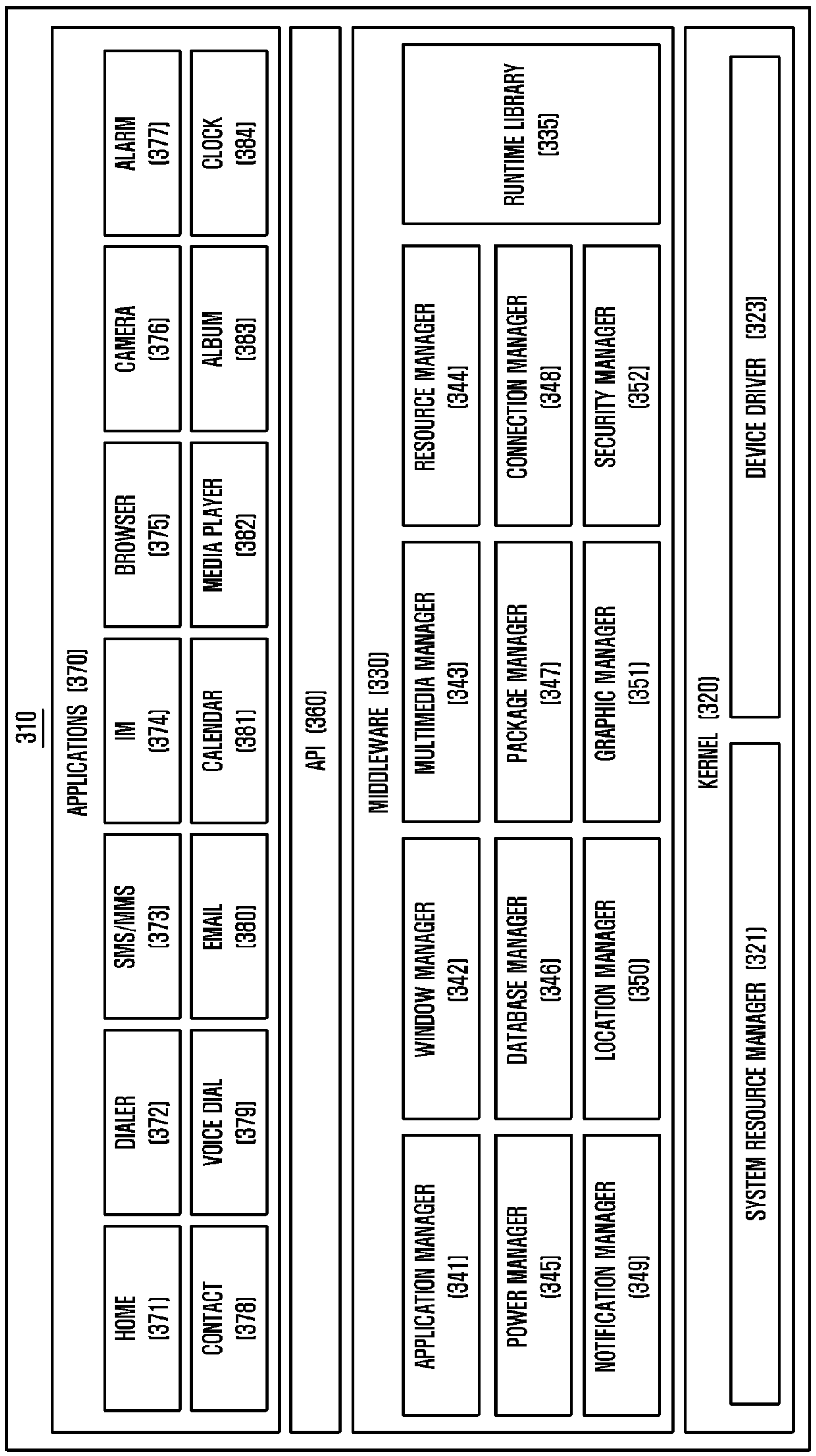
FIG. 3 is a block diagram of a program module, according to an embodiment of the present disclosure.

FIG. 3 is a block diagram of a program module, according to an embodiment of the present disclosure.

Referring to FIG. 3, a programming module 310 is provided. The programming module 310 may be included (or stored) in the memory 130 of the electronic device 100 illustrated in FIG. 1, or may be included (or stored) in the memory 230 of the electronic device 201 illustrated in FIG. 2. At least a part of the programming module 310 may be implemented in software, firmware, hardware, or a combination of two or more thereof.

The programming module 310 may be implemented in hardware, and may include an operating system (OS) controlling resources related to the electronic device 100 and/or various applications 370 executed in the OS. For example, the OS may be Android™, iOS™, Windows™, Symbian™, Tizen™, Bada™, and the like.

The programming module 310 may include a kernel 320, a middleware 330, an API 360, and/or the applications 370.

The kernel 320 may include a system resource manager 321 and/or a device driver 323.

The system resource manager 321 may include a process manager, a memory manager, and a file system manager. The system resource manager 321 may perform the control, allocation, recovery, and/or the like of system resources.

The device driver 323 may include a display driver, a camera driver, a BT driver, a shared memory driver, a USB driver, a keypad driver, a Wi-Fi driver, and/or an audio driver. Also, the device driver 312 may include an inter-process communication (IPC) driver.

The middleware 330 may include multiple modules previously implemented so as to provide a function used in common by the applications 370. Also, the middleware 330 may provide a function to the applications 370 through the API 360 in order to enable the applications 370 to efficiently use limited system resources within the electronic device 100. The middleware 330 may include at least one of a runtime library 335, an application manager 341, a window manager 342, a multimedia manager 343, a resource manager 344, a power manager 345, a database manager 346, a package manager 347, a connection manager 348, a notification manager 349, a location manager 350, a graphic manager 351, a security manager 352, and any other suitable and/or similar managers.

The runtime library 335 may include a library module used by a complier, in order to add a new function by using a programming language during the execution of the applications 370. The runtime library 335 may perform functions which are related to input and output, the management of a memory, an arithmetic function, and/or the like.

The application manager 341 may manage a life cycle of at least one of the applications 370.

The window manager 342 may manage graphical user interface (GUI) resources used on the screen.

The multimedia manager 343 may detect a format used to reproduce various media files and may encode or decode a media file through a codec appropriate for the relevant format.

The resource manager 344 may manage resources, such as a source code, a memory, a storage space, and/or the like of at least one of the applications 370.

The power manager 345 may operate together with a basic input/output system (BIOS), may manage a battery or power, and may provide power information and the like used for an operation.

The database manager 346 may manage a database in such a manner as to enable the generation, search and/or change of the database to be used by at least one of the applications 370.

The package manager 347 may manage the installation and/or update of an application distributed in the form of a package file.

The connection manager 348 may manage a wireless connectivity such as Wi-Fi and BT.

The notification manager 349 may display or report, to the user, an event such as an arrival message, an appointment, a proximity alarm, and the like in such a manner as not to disturb the user.

The location manager 350 may manage location information of the electronic device 100. The graphic manager 351 may manage a graphic effect, which is to be provided to the user, and/or a user interface related to the graphic effect. The security manager 352 may provide various security functions used for system security, user authentication, and the like. When the electronic device 100 has a telephone function, the middleware 330 may further include a telephony manager for managing a voice telephony call function and/or a video telephony call function of the electronic device 100.

The middleware 330 may generate and use a new middleware module through various functional combinations of the above-described internal element modules. The middleware 330 may provide modules specific to the types of OSs in order to provide differentiated functions. Also, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 360 is a set of API programming functions, and may be provided with a different configuration according to an OS. In the case of Android™ or iOS™ one API set may be provided to each platform. In the case of Tizen™ two or more API sets may be provided to each platform.

The applications 370 may include a preloaded application and/or a third party application. The applications 370 may include a home application 371, a dialer application 372, a short message service (SMS)/multimedia message service (MMS) application 373, an instant message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar applications.

At least a part of the programming module 310 may be implemented by instructions stored in a non-transitory computer-readable storage medium. When the instructions are executed by one or more processors 210, the one or more processors 210 may perform functions corresponding to the instructions. The non-transitory computer-readable storage medium may be the memory 220. At least a part of the programming module 310 may be executed by the one or more processors 210. At least a part of the programming module 310 may include a module, a program, a routine, a set of instructions, and/or a process for performing one or more functions. The term "module" used in the present disclosure may refer to a unit including one or more combinations of hardware, software, and firmware. The term "module" may be used interchangeably with a term, such as "unit," "logic," "logical block," "component," "circuit," or the like. The "module" may be a minimum unit of a component formed as one body or a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing certain operations which have been known or are to be developed in the future.

Examples of computer-readable media include magnetic media; such as hard disks, floppy disks, and magnetic tape; optical media, such as CD-ROM and DVD; magneto-optical media, such as floptical disks; and hardware devices that are specially configured to store and perform program instructions (e.g., programming modules), such as ROM, RAM, flash memory, etc. Examples of program instructions include machine code instructions created by assembly languages, such as a compiler, and code instructions created by a high-level programming language executable in computers using an interpreter, etc. The described hardware devices may be configured to act as one or more software modules in order to perform the operations and methods described above, or vice versa.

Modules or programming modules according to the embodiments of the present disclosure may include one or more components, remove part of them described above, or include new components. The operations performed by modules, programming modules, or the other components, according to the present disclosure, may be executed in serial, parallel, repetitive or heuristic fashion. Part of the operations can be executed in any other order, skipped, or executed with additional operations. FIGS. 4A to 4F are block diagrams of an electronic device for processing audio data, according to an embodiment of the present disclosure.

Referring to FIGS. 4A to 4F, an audio processor 400 and a plurality of speakers, such as a first speaker 491, a second speaker 493, a third speaker 495, and a fourth speaker 497 are provided. The electronic device 101 or 201, according to an embodiment of the present disclosure, may include the audio processor 400 and the speakers 491, 493, 495, and 497. The audio processor 400 may obtain audio signals from external devices by using the communications module 220.

The audio processor 400 may be a codec that encodes and decodes data in order to output the received audio or video data. The audio processor 400 may store software to execute functions of compressing and decompressing data streams or signals. The audio processor 400 may be mounted in the electronic device 101 or 201 to be separated from the processor 120 or 210. An audio processor 500, according to another embodiment, as shown in FIGS. 5A to 5F, may be included in the processor 120 or 210. The audio processor 500 may be configured as an independent module.

The audio data may be a signal having a frequency. For example, the audio data may be a signal that has an audible frequency of 20 Hz to 20 kHz.

The plurality of speakers 491, 493, 495, and 496 may be configured as a speaker array, or may be configured with a main speaker and secondary speakers.

Figure 4A:
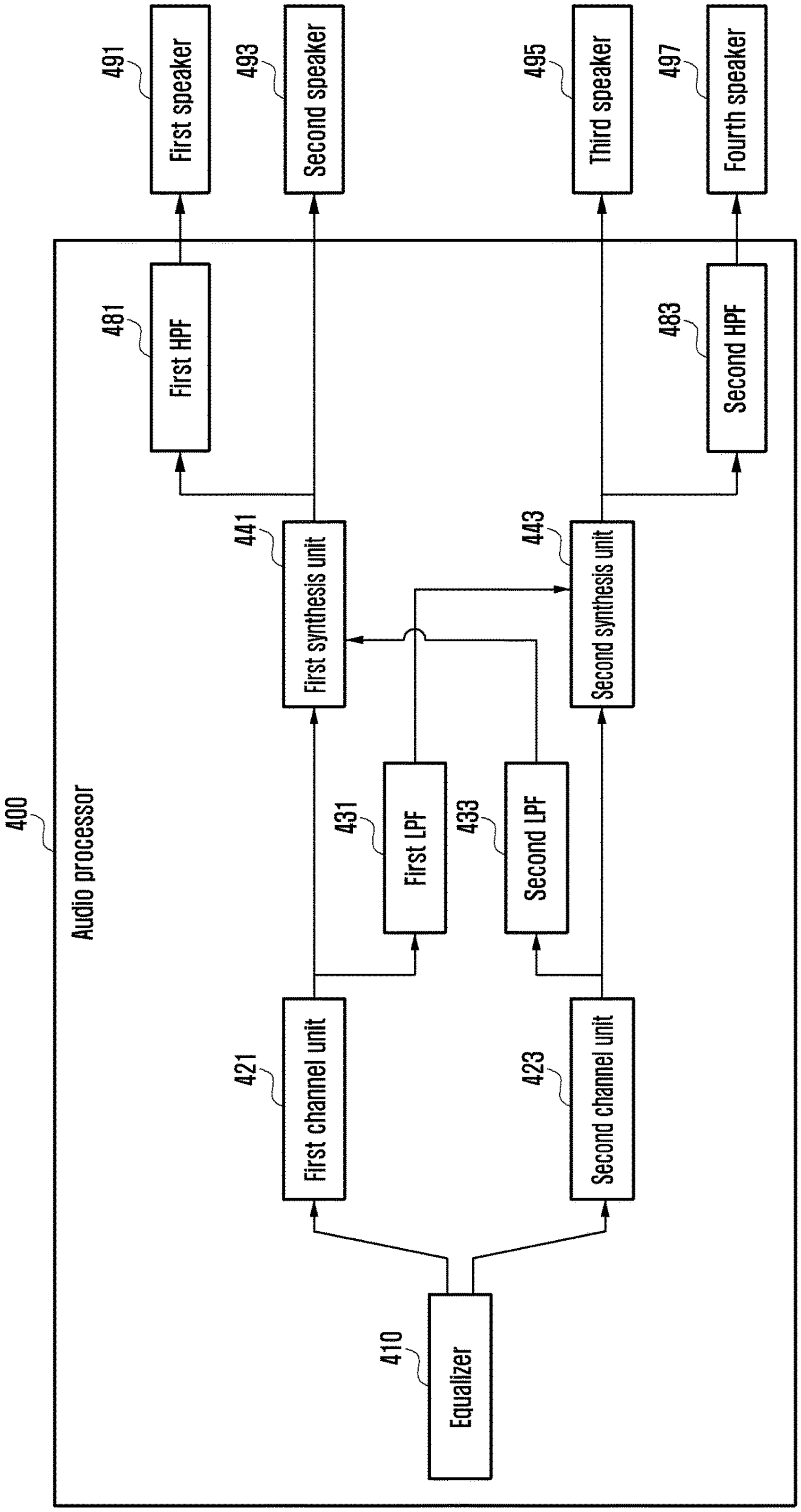
FIGS. 4A to 4F are block diagrams of an electronic device for processing audio data, according to an embodiment of the present disclosure.
Figure 4B:
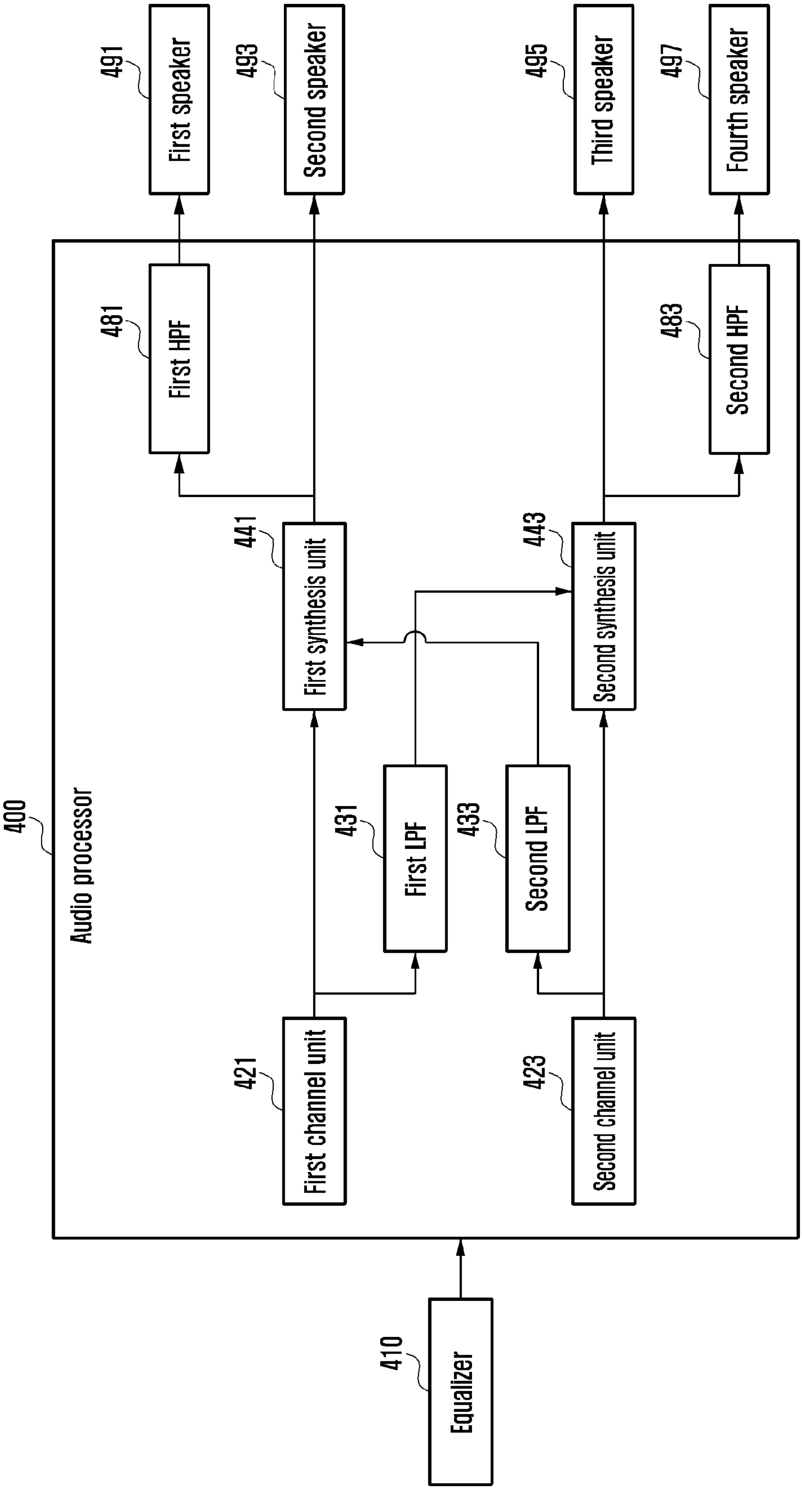

Referring to FIGS. 4A and 4B, the audio processor 400 and the plurality of speakers, 491, 493, 495, and 497 are provided. The audio processor 400 may process an audio signal that is received from the outside to then be output through the speaker.

The audio processor 400 may include an equalizer 410. The equalizer 410 may adjust the frequency of an audio signal that is received from the outside. For example, the equalizer 410 may change the frequency characteristic of the received audio signal. As an additional example, the equalizer 410 may be a graphic equalizer that divides the audio signal into several sound levels or a parametric equalizer that freely varies the frequency by means of a boost-cut function.

As shown in FIG. 4B, the equalizer 410 may be external to the electronic device 101 or 201. For example, the audio processor 400 may receive an audio signal that has been processed through an external equalizer 410.

The equalizer 410 may transfer the received audio signal to a first channel unit 421 and a second channel unit 423, respectively.

Based on at least some of the audio signal the first channel signal and the second channel signal may be obtained. The first channel unit 421 may receive a signal corresponding to the left channel of the audio signal. The second channel unit 423 may receive a signal corresponding to the right channel of the audio signal. For example, in the case of the plurality of speakers 491, 493, 495, and 496, the left channel and the right channel may be channels in which the type of audio signal (e.g., the stereo type of audio signal) to be output to the speakers is separated.

The first channel unit 421 may transfer signals that are received from the equalizer 410 to a first low pass filter (LPF) 431 and the first synthesis unit 441. The second channel unit 423 may transfer signals that are received from the equalizer 410 to a second LPF 433 and the second synthesis unit 443.

The first LPF 431 and the second LPF 433 may be filters that pass audio signals corresponding to the first frequency band. For example, the LPF may support a function of passing a frequency component that is lower than a specific frequency and of blocking a frequency component that is higher than the specific frequency. The specific frequencies (e.g., cut-off frequencies or reference frequencies) of the first LPF 431 and the second LPF 433 may be identical to each other. The specific frequencies (e.g., cut-off frequencies or reference frequencies) of the first LPF 431 and the second LPF 433, according to another embodiment, may be configured to be different from each other.

The first LPF 431 may create a frequency audio signal that corresponds to the first frequency band through the filtering. The first LPF 431 may transfer the created frequency audio signal to the second synthesis unit 443.

The second LPF 433 may create a frequency audio signal that corresponds to the first frequency band through the filter. The second LPF 433 may transfer the created frequency audio signal to the first synthesis unit 441.

The first synthesis unit 441 may create a synthetic audio signal by synthesizing the signals of the first channel unit 421 and the second LPF 433.

The first synthesis unit 441 may transfer the created synthetic audio signal to a first high pass filter (HPF) 481. The first HPF 481 may be a filter that passes audio signals corresponding to the second frequency band. For example, the HPF may support a function of passing a frequency component that is higher than a specific frequency and of blocking a frequency component that is lower than the specific frequency. The first HPF 481 may pass an audio signal that has a higher frequency band than a specific frequency among the synthetic audio signals that are received from the first synthesis unit 441. The audio signal having a higher frequency band than a specific frequency may be output through the first speaker 491.

The first synthesis unit 441 may transfer the created synthetic audio signal to the second speaker 493. The synthetic audio signal may be output through the second speaker 493.

The second synthesis unit 443 may create a synthetic audio signal by synthesizing the signals of the second channel unit 423 and the first LPF 431. The second synthesis unit 443 may transfer the created synthetic audio signal to the third speaker 495. The synthetic audio signal may be output through the third speaker 495.

The second synthesis unit 443 may transfer the created synthetic audio signal to the second HPF 483. The second HPF 483 may be a filter that passes an audio signal corresponding to the second frequency band. The second HPF 483 may pass an audio signal that has a higher frequency band than a specific frequency among the synthetic audio signals that are received from the second synthesis unit 443. The audio signal having a higher frequency band than a specific frequency may be output through the fourth speaker 497.

The audio processor 400 may include, or exclude, a filter that supports a function of removing noise of the audio signal or a function of passing a specific band.

Figure 4C:
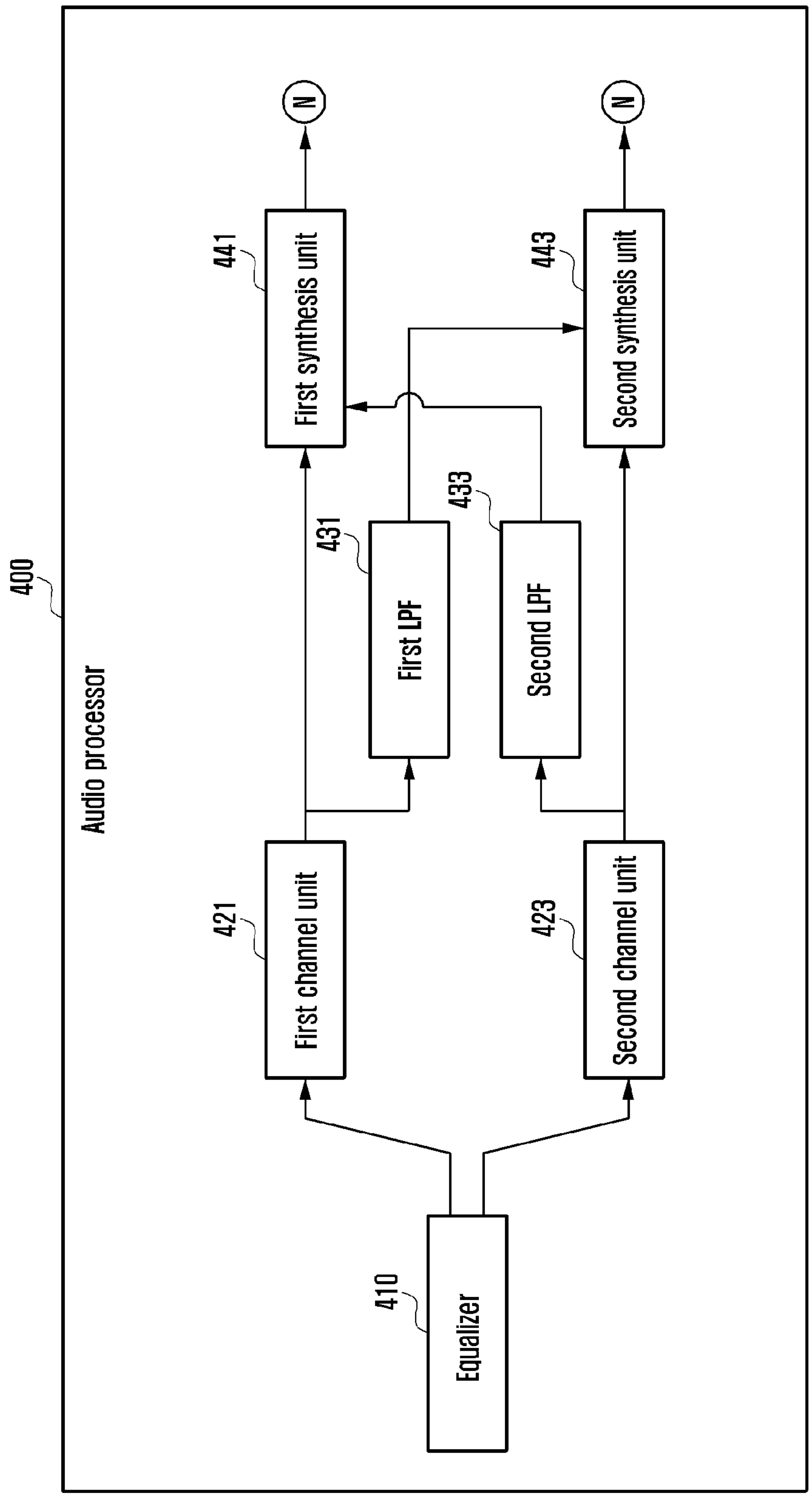
Figure 4D:
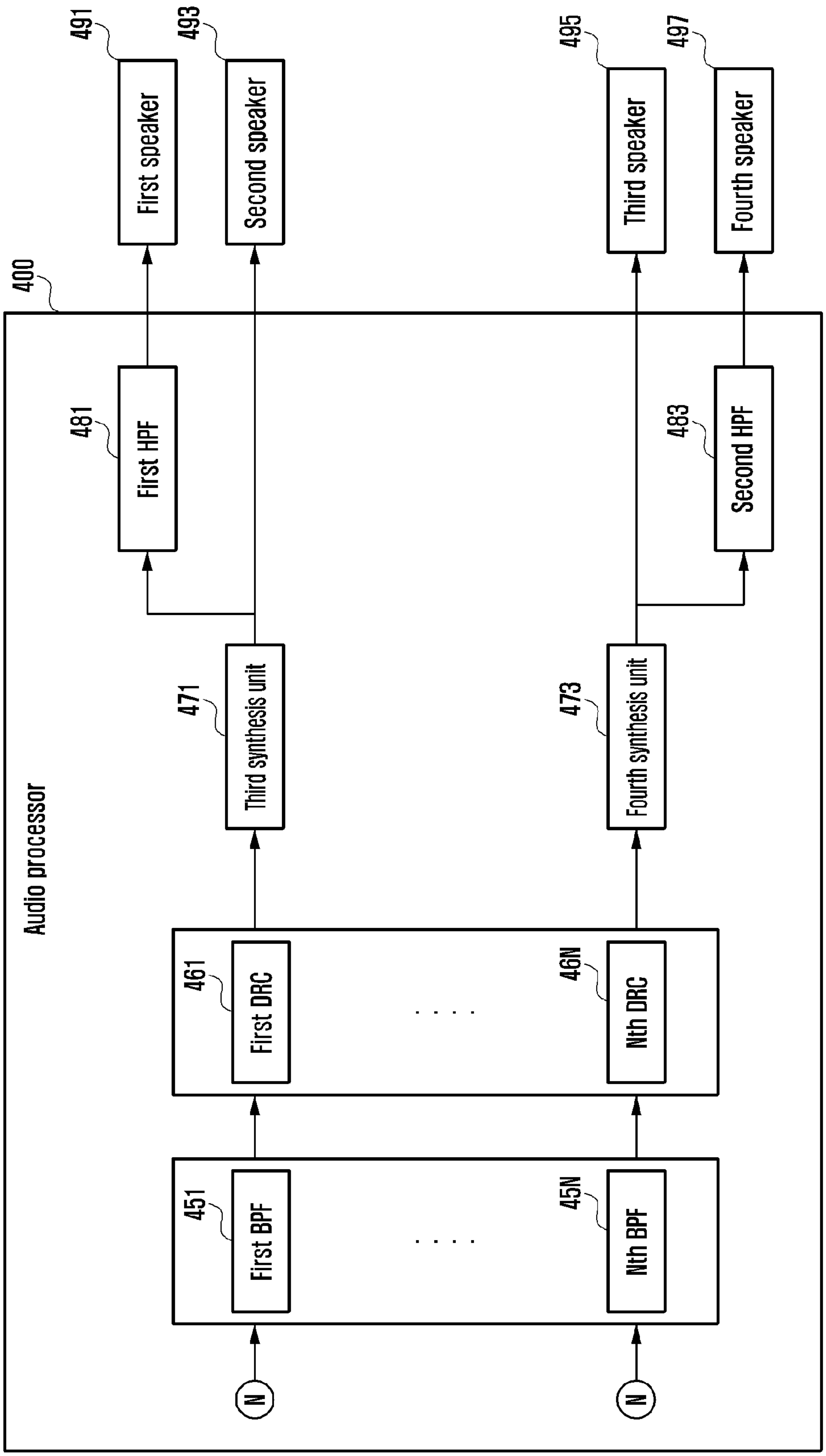

Referring to FIGS. 4C and 4D, the audio processor 400 is provided. The audio processor 400 may process the audio signal that is received from the outside, and may output the same through the plurality of speakers 491, 493, 495, and 496.

The audio processor 400 shown in FIG. 4C includes configurations that are similar to the functions of the equalizer 410, the first channel unit 421, the second channel unit 423, the first LPF 431, and the second LPF 433 of the audio processor 400 shown in FIG. 4A, thus the related description will be omitted.

The first synthesis unit 441 may transfer the created synthetic audio signal to one or more band pass filters (BPFs) 451 to 45N. The second synthesis unit 443 may transfer the created synthetic audio signal to one or more BPFs 451 to 45N. The band pass filter may be a filter that passes frequencies between the first cut-off frequency and the second cut-off frequency in order to thereby obtain an output.

One or more band pass filters 451 to 45N may separate the synthetic audio signals that are received from the first synthesis unit 441 and the second synthesis unit 443 to then be transferred. For example, one or more band pass filters that receive synthetic audio signal from the first synthesis unit 441 may be different from one or more band pass filters that receive synthetic audio signals from the second synthesis unit 443.

The synthetic audio signal that is created by the first synthesis unit 441 may be transferred to two band pass filters, and the synthetic audio signal that is created by the second synthesis unit 443 may be transferred to another two band pass filters. For example, each synthesis unit (the first synthesis unit 441 and the second synthesis unit 443) may be connected with two band pass filters, respectively, based on a frequency of 90 Hz among the frequency band.

Three band pass filters 451 to 45N may be connected to each synthesis unit (the first synthesis unit 441 or the second synthesis unit 443). For example, three band pass filters may pass signals corresponding to a low band frequency, a medium band frequency, and a high band frequency, respectively, with respect to the synthetic audio signals that are received from the first synthesis unit 441. Another three band pass filters may pass signals corresponding to a low band frequency, a medium band frequency, and a high band frequency, respectively, with respect to the synthetic audio signals that are received from the second synthesis unit 443. The low band, the medium band, and the high band are relative concepts, and may be determined according to a ratio to the overall received frequencies. Alternatively, each cut-off frequency value may be specified or changed in advance.

One or more band pass filters 451 to 45N may pass an audio signal between specific frequencies to then be transferred to one or more dynamic range controls (DRCs) 461 to 46N. The DRC may remove noise of the audio signal. For example, the DRC may correct the output distortion of the audio signal, and may compensate for the amplitude.

One or more DRCs 461 to 46N may be configured based on the number of band pass filters 451 to 45N or the band pass filters that are separated by the synthesis units (the first synthesis unit 441 and the second synthesis unit 443). For example, in the case where two band pass filters 451 to 45N are configured with respect to each synthesis unit (the first synthesis unit 441 or the second synthesis unit 443), two DRCs 461 to 46N may be configured as well. As another example, in the case where the band pass filter that is connected to the first synthesis unit 441 is different from the band pass filter that is connected to the second synthesis unit 443, different DRCs 461 to 46N may be connected to the separated band pass filters, respectively.

One or more DRCs 461 to 46N may transfer an output signal to the third synthesis unit 471 and the fourth synthesis unit 473. The audio signals that are received by the third synthesis unit 471 and the fourth synthesis unit 473 from one or more DRCs 461 to 46N may be different from each other in consideration of the connection of the one or more DRCs 461 to 46N and the one or more band pass filters 451 to 45N. For example, one or more DRCs 461 to 46N that are connected with the first synthesis unit 441 and with one or more band pass filters 451 to 45N may be different from one or more DRCs 461 to 46N that are connected with the second synthesis unit 443 and with one or more band pass filters 451 to 45N, which are different from the band pass filter that is connected with the first synthesis unit 441. The third synthesis unit 471 may transfer an output signal to the first HPF 481 and the second speaker 493.

The first HPF 481 may be a filter that passes an audio signal corresponding to the second frequency band. For example, the HPF may support a function of passing a higher frequency component than a specific frequency and of blocking a lower frequency component than the specific frequency. The first HPF 481 may receive a signal that is output from the third synthesis unit 471 to then output the same through the first speaker 491.

The second speaker 493 may output the audio signal that is received from the third synthesis unit 471.

The fourth synthesis unit 473 may transfer an output signal to the second HPF 483 and the third speaker 495.

The second HPF 483 may be a filter that passes an audio signal corresponding to the second frequency band. For example, the HPF may support a function of passing a higher frequency component than a specific frequency and of blocking a lower frequency component than the specific frequency. The second HPF 483 may receive a signal that is output from the fourth synthesis unit 473 to then output the same through the fourth speaker 497.

The third speaker 495 may output the audio signal that is received from the fourth synthesis unit 473.

The specific frequencies (e.g., cut-off frequencies or reference frequencies) of the first HPF 481 and the second HPF 483 may be identical to each other. The specific frequencies (e.g., cut-off frequencies or reference frequencies) of the first HPF 481 and the second HPF 483 may be configured to be different from each other.

The electronic device 101 or 201 may include the first speaker 491 that outputs audio signals of the first frequency band (e.g., a high frequency band), the second speaker 493 that outputs audio signals, and the processor 120 or 400.

Figure 4E:
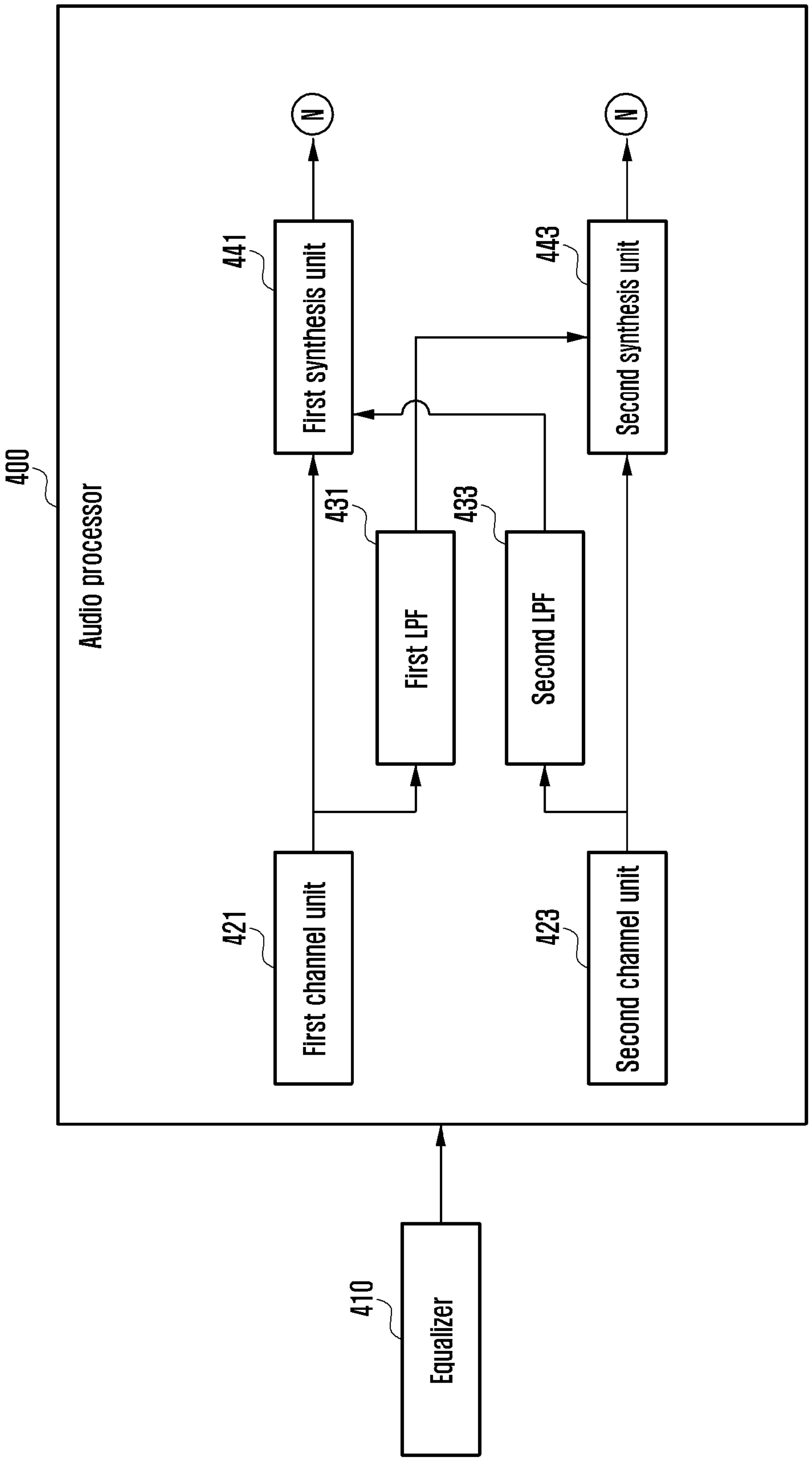
Figure 4F:
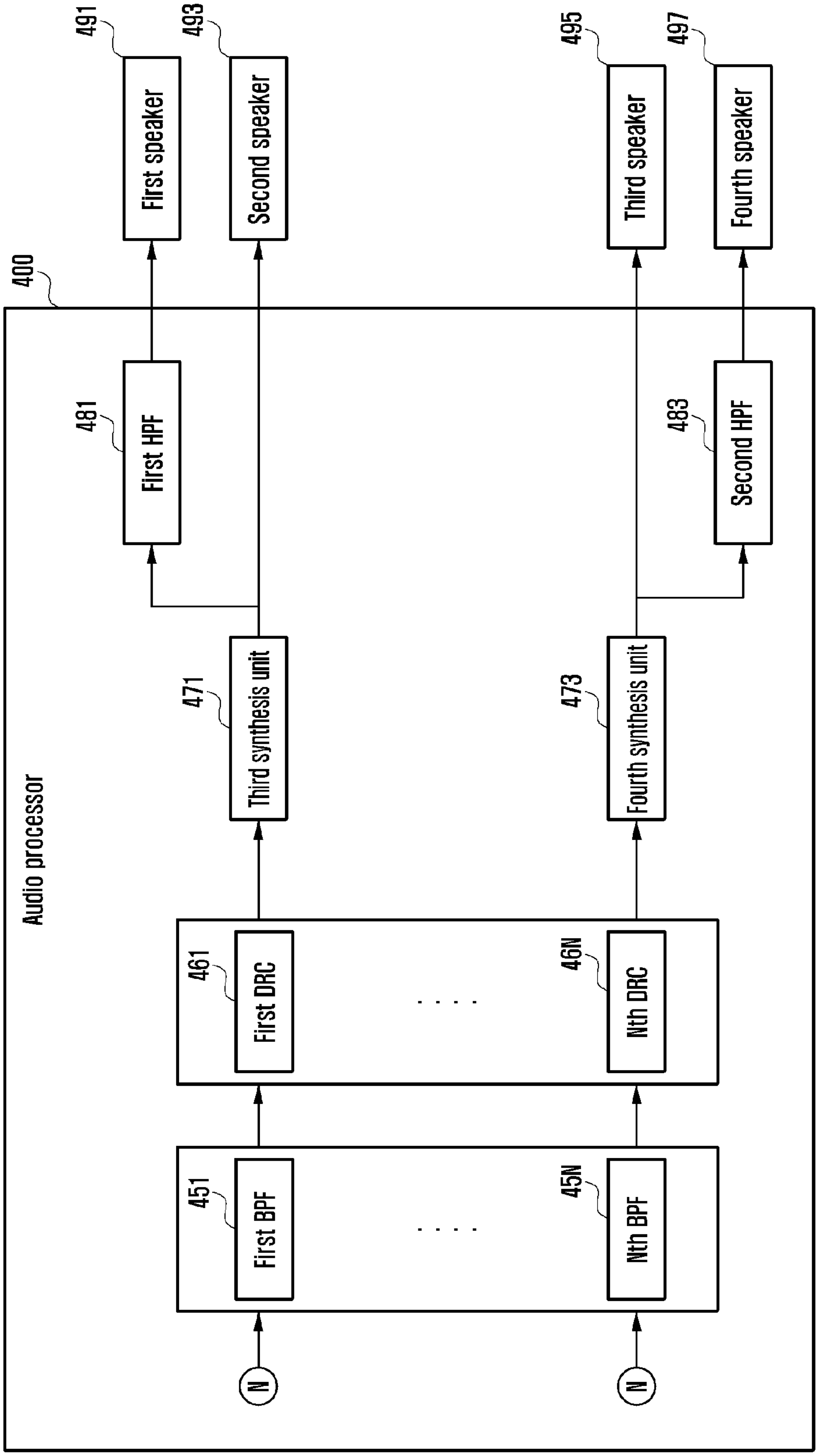

Referring to FIGS. 4E and 4F, the audio processor 400 and an external equalizer 410 are provided. That is, the equalizer 410 may be external to the electronic device 101 or 201. For example, the audio processor 400 may receive an audio signal that has been processed through an external equalizer 410. The description related to the audio processor 400 and the plurality of speakers 491, 493, 495, and 497 is similar to that of FIGS. 4C and 4D, and thus will be omitted here.

The processor 120 or 400 may create the third audio signal by synthesizing at least some of the first audio signal of the second frequency band (e.g., a low frequency band) corresponding to the first channel (e.g., the left channel) of the audio signal and the second audio signal corresponding to the second channel (e.g., the right channel) of the audio signal.

The processor 120 or 400 may output the third audio signal through the speaker 493. The processor 120 or 400 may output, through the first speaker 491, the fourth audio signal corresponding to the first frequency band (e.g., a high frequency band) among the third audio signal by using a filter that passes the first frequency band (e.g., a high frequency band).

The processor 120 or 400 may create the fifth audio signal by synthesizing at least some of the third audio signal of the second frequency band (e.g., a low frequency band) corresponding to the second channel (e.g., the right channel) and the fourth audio signal corresponding to the first channel (e.g., the left channel).

The processor 120 or 400 may output the fifth audio signal through the third speaker 495. The processor 120 or 400 may output, through the fourth speaker 497, the sixth audio signal corresponding to the first frequency band (e.g., a high frequency band) among the fifth audio signal by using a filter that passes the first frequency band (e.g., a high frequency band).

FIGS. 5A to 5F are block diagrams of an electronic device for processing audio data, according to an embodiment of the present disclosure.

Figure 5A:
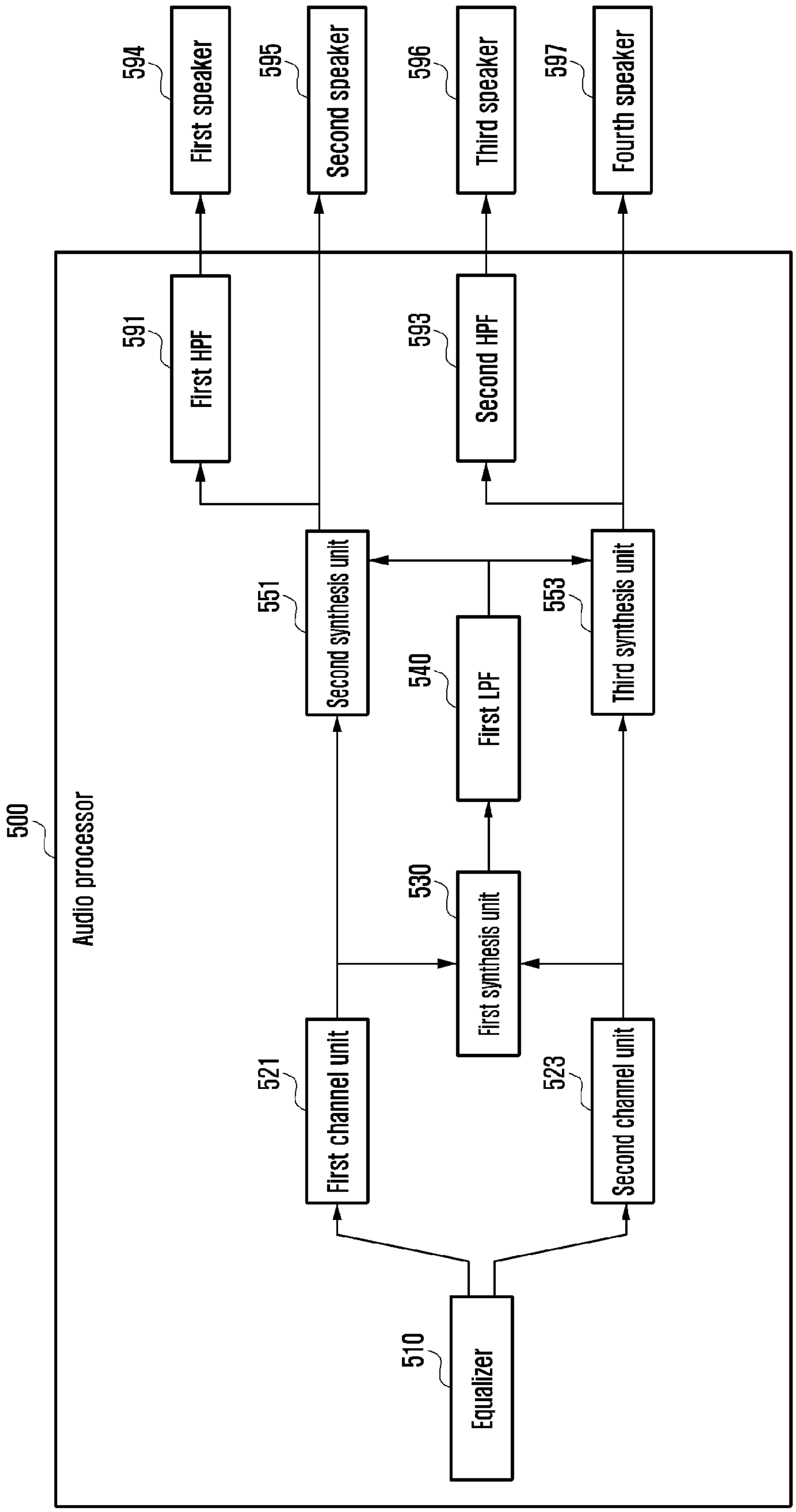
FIGS. 5A to 5F are block diagrams of an electronic device for processing audio data, according to an embodiment of the present disclosure.
Figure 5B:
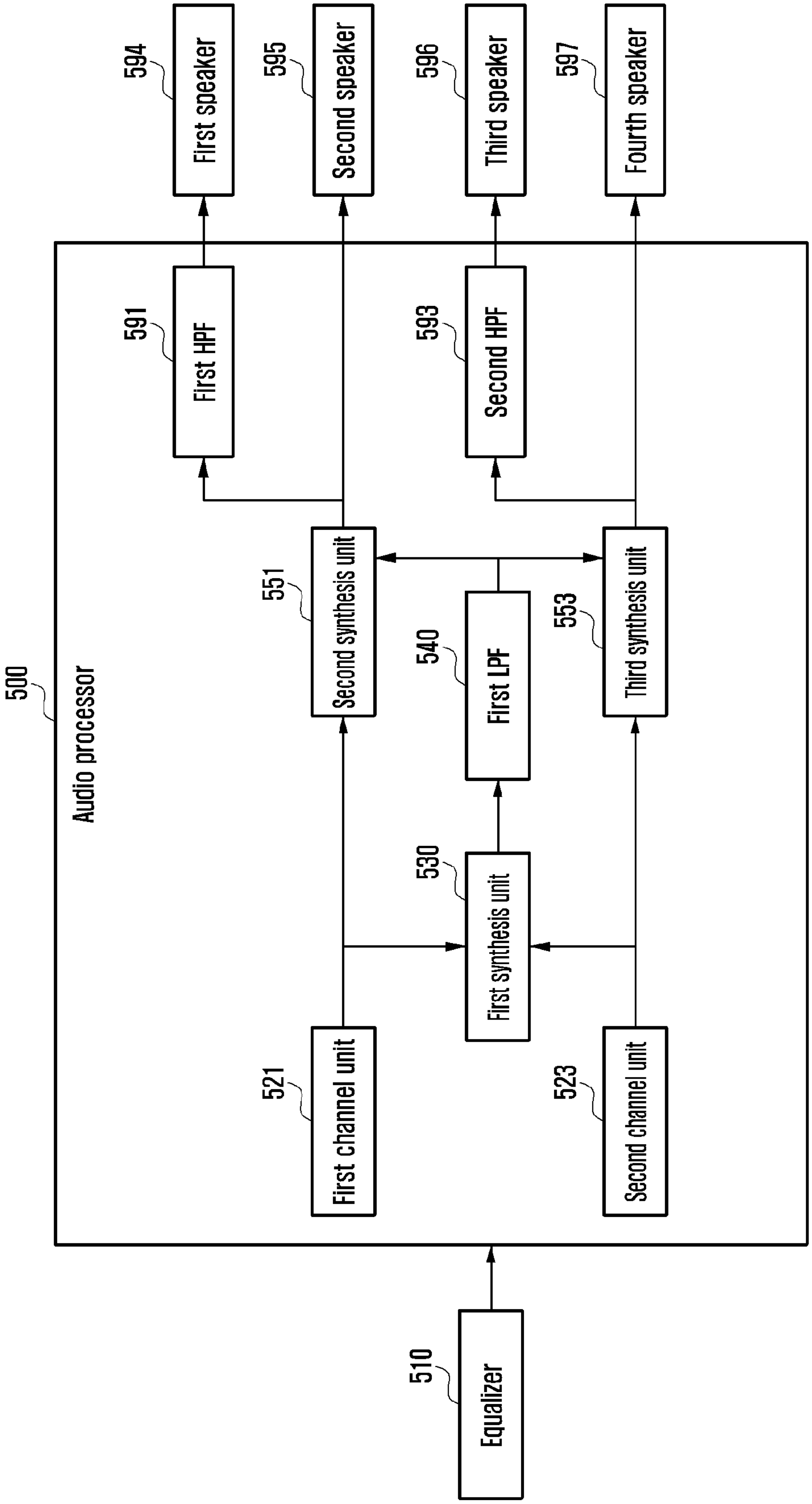

Referring to FIGS. 5A and 5B, an audio processor 500 and a plurality of speakers, such as a first speaker 594, a second speaker 595, a third speaker 596, or a fourth speaker 597 are provided. The audio processor 500 may process an audio signal that is received from the outside, and may output the same through the plurality of speakers 594, 595, 596, and 597.

The audio processor 500, may include an equalizer 510. The equalizer 510 may adjust the frequency of an audio signal that is received from the outside. For example, the equalizer 510 may change the frequency characteristic of the received audio signal. As an additional example, the equalizer 510 may be a graphic equalizer that divides the audio signal into several sound levels or a parametric equalizer that freely varies the frequency by means of a boost-cut function.

As shown in FIG. 5B, the equalizer 510 may be external to the electronic device 101 or 201. For example, the audio processor 500 may receive an audio signal that has been processed through the external equalizer 510.

The equalizer 510 may transfer the received audio signal to two channel units 521 and 523, respectively.

Based on at least some of the audio signal the first channel signal and the second channel signal may be obtained. The first channel unit 521 may receive a signal corresponding to the left channel of the audio signal. The second channel unit 523 may receive a signal corresponding to the right channel of the audio signal. For example, in the case of a plurality of speakers, the left channel and the right channel may be channels in which the type of audio signal (e.g., the stereo type of audio signal) to be output to the plurality of speakers 594, 595, 596, or 597 is separated.

The first channel unit 521 may transfer an output signal to the first synthesis unit 530 and the second synthesis unit 551. The first channel unit 521 may transfer an output signal to the first synthesis unit 530 and the second synthesis unit 551. The second channel unit 523 may transfer an output signal to the first synthesis unit 530 and the third synthesis unit 553.

The first synthesis unit 530 may synthesize signals that are received from the first channel unit 521 and the second channel unit 523 in order to thereby create a synthetic audio signal. The first synthesis unit 530 may transfer the synthetic audio signal to the first LPF 540.

The first LPF 540 may be a filter that passes audio signals corresponding to the first frequency band. For example, the LPF may support a function of passing a frequency component that is lower than a specific frequency and of blocking a frequency component that is higher than the specific frequency. The first LPF 540 may transfer the filtered audio signal to the second synthesis unit 551 and the third synthesis unit 553.

The second synthesis unit 551 may overlap an audio signal that is received from the first channel unit 521 and a signal that is received from the first LPF 540 in order to create a synthetic audio signal.

The second synthesis unit 551 may transfer the created synthetic audio signal to the first HPF 591. The first HPF 591 may be a filter that passes an audio signal corresponding to the second frequency band. For example, the HPF may support a function of passing a frequency component that is higher than a specific frequency and of blocking a frequency component that is lower than the specific frequency. The first HPF 591 may pass an audio signal that has a higher frequency band than a specific frequency among the synthetic audio signal received from the second synthesis unit 551. The audio signal having a higher frequency band than a specific frequency may be output through the first speaker 594.

The second synthesis unit 551 may transfer the created synthetic audio signal to the second speaker 595. The synthetic audio signal may be output through the second speaker 595. The third synthesis unit 553 may overlap an audio signal that is received from the second channel unit 523 and a signal that is received from the first LPF 540 in order to create a synthetic audio signal. The third synthesis unit 553 may transfer the created synthetic audio signal to the fourth speaker 597. The synthetic audio signal may be output through the fourth speaker 597.

The third synthesis unit 553 may transfer the created synthetic audio signal to the second HPF 593. The second HPF 593 may be a filter that passes an audio signal corresponding to the second frequency band. The second HPF 593 may pass an audio signal that has a higher frequency band than a specific frequency among the synthetic audio signal that is received from the third synthesis unit 553. The audio signal having a higher frequency band than a specific frequency may be output through the third speaker 596.

The audio processor 500 may include, or exclude, a filter that supports a function of removing noise of the audio signal or a function of passing a specific band.

Figure 5C:
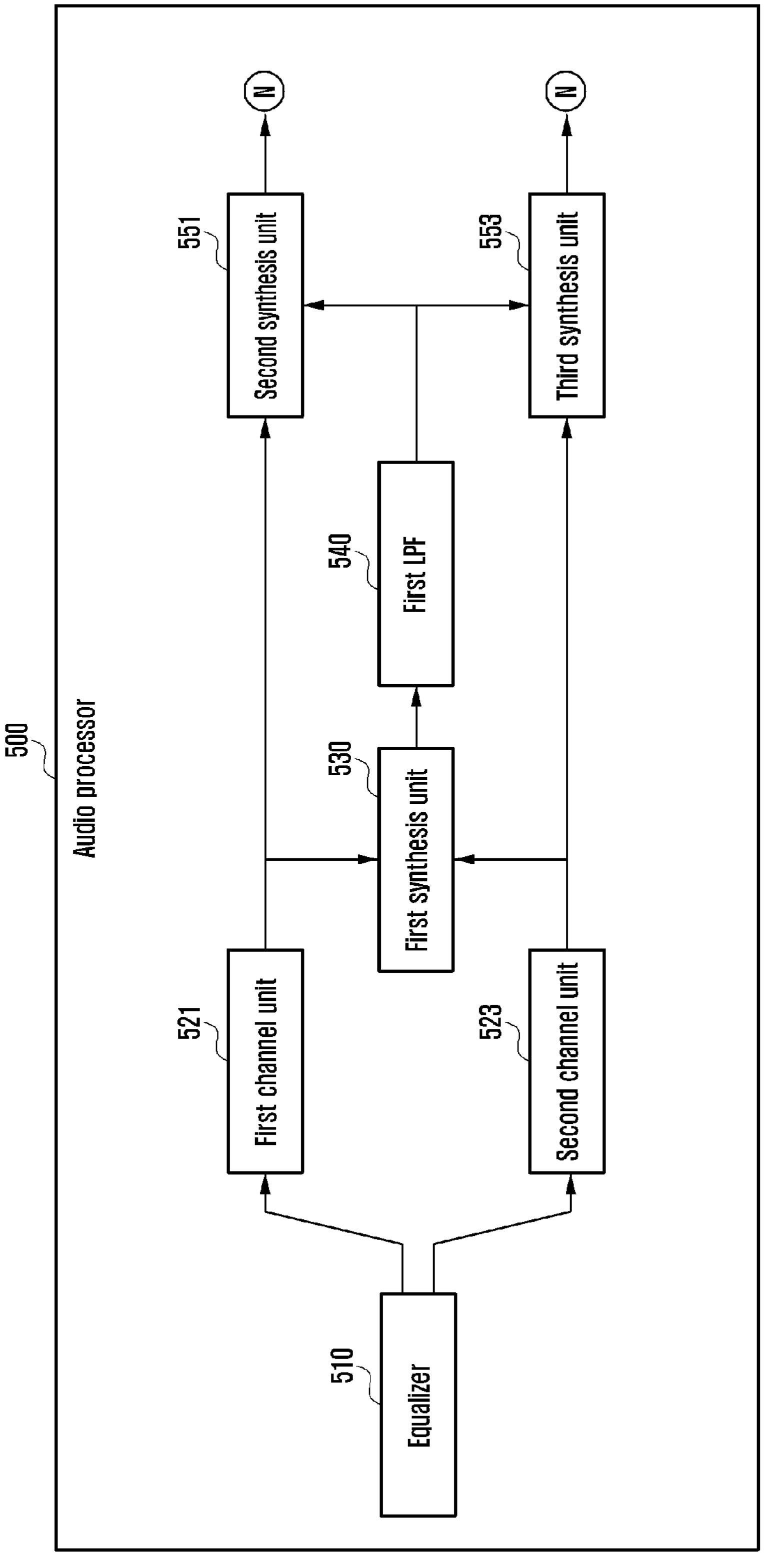
Figure 5D:
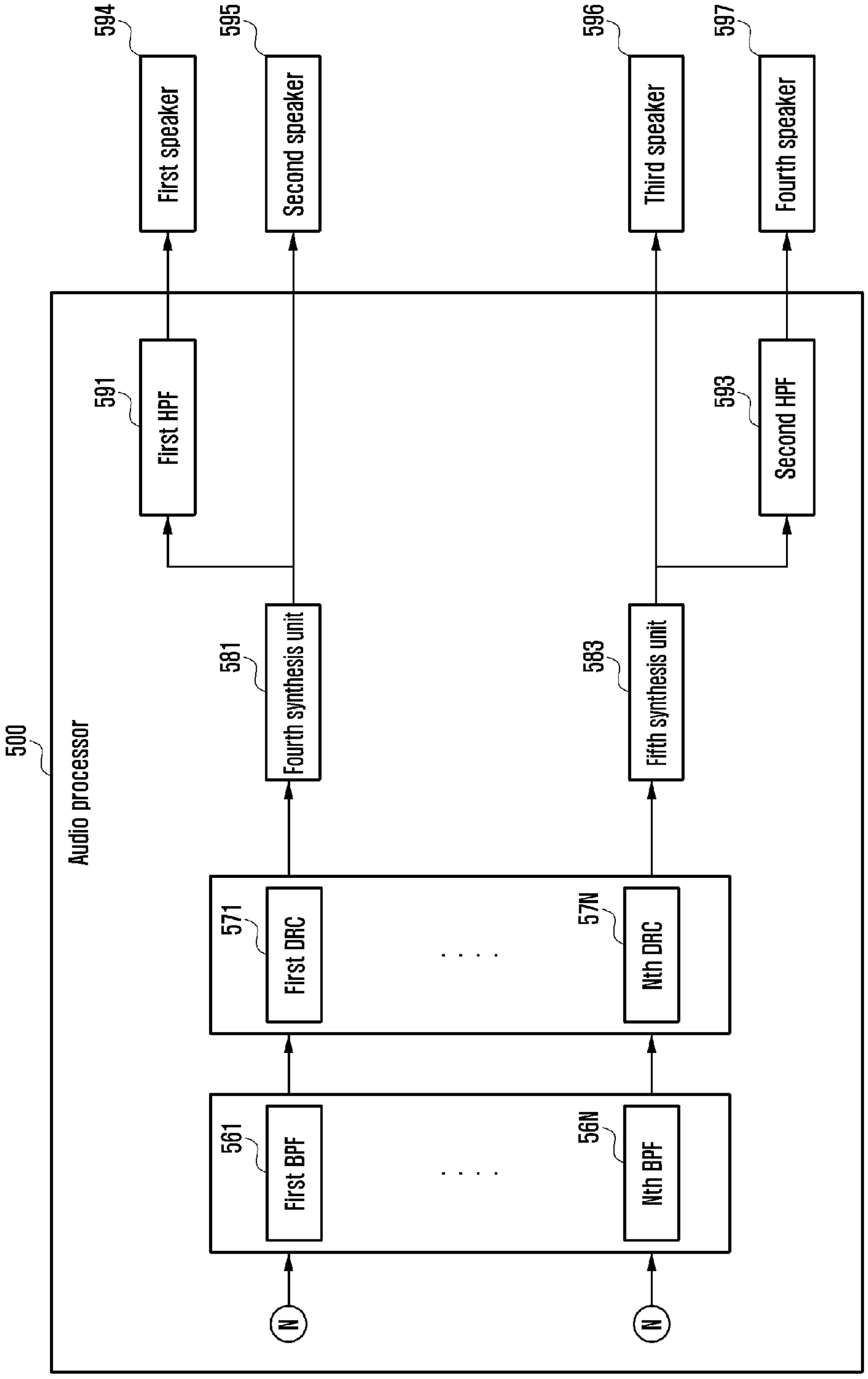

Referring to FIGS. 5C and 5D, the audio processor 500 is provided. The audio processor 500 may process an audio signal that is received from the outside, and may output the same through the plurality of speakers 594, 595, 596, or 597.

The audio processor 500 shown in FIG. 5C includes configurations that are similar to the functions of the equalizer 510, the first channel unit 521, the second channel unit 523, the first synthesis unit 530, and the first LPF 540 of the audio processor 500 shown in FIG. 5A, thus the related description will be omitted.

The second synthesis unit 551 may transfer the created synthetic audio signal to one or more BPFs 561 to 56N. The second synthesis unit 551 may transfer the created synthetic audio signal to one or more BPFs 561 to 56N. The band pass filter may be a filter that passes frequencies between the first cut-off frequency and the second cut-off frequency in order to thereby obtain an output.

One or more band pass filters 561 to 56N may separate the synthetic audio signals that are received from the second synthesis unit 551 and the third synthesis unit 553 to then be transferred. For example, one or more band pass filters that receive synthetic audio signals from the second synthesis unit 551 may be different from one or more band pass filters that receive synthetic audio signals from the third synthesis unit 553.

The synthetic audio signal that is created by the second synthesis unit 551 may be transferred to two band pass filters, and the synthetic audio signal that is created by the third synthesis unit 553 may be transferred to another two band pass filters. For example, each synthesis unit (the second synthesis unit 551 and the third synthesis unit 553) may be connected with two band pass filters, respectively, based on a frequency of 90 Hz among the frequency band. Three band pass filters 561 to 56N may be connected to each synthesis unit (the second synthesis unit 551 and the third synthesis unit 553). For example, three band pass filters may pass signals corresponding to a low band frequency, a medium band frequency, and a high band frequency, respectively, with respect to the synthetic audio signal that is received from the second synthesis unit 551. Another three band pass filters may pass signals corresponding to a low band frequency, a medium band frequency, and a high band frequency, respectively, with respect to the synthetic audio signal that is received from the third synthesis unit 553. The low band, the medium band, and the high band are relative concepts, and may be determined according to a ratio to the overall received frequencies. Alternatively, each cut-off frequency value may be specified or changed in advance.

One or more band pass filters 561 to 56N may pass an audio signal between specific frequencies to then be transferred to one or more DRCs 571 to 57N. The DRC may remove noise of the audio signal. For example, the DRC may correct the output distortion of the audio signal, and may compensate for the amplitude.

One or more DRCs 571 to 57N may be configured based on the number of band pass filters 561 to 56N or the band pass filters that are separated by the synthesis units (the second synthesis unit 551 and the third synthesis unit 553). For example, in the case where two band pass filters 561 to 56N are configured with respect to each synthesis unit (the second synthesis unit 551 or the third synthesis unit 553), two DRCs 571 to 57N may be configured as well. As another example, in the case where the band pass filter that is connected to the second synthesis unit 551 is different from the band pass filter that is connected to the third synthesis unit 553, different DRCs 571 to 57N may be connected to the separated band pass filters, respectively.

One or more DRCs 571 to 57N may transfer an output signal to the fourth synthesis unit 581 and the fifth synthesis unit 583. The audio signals that are received by the fourth synthesis unit 581 and the fifth synthesis unit 583 from one or more DRCs 571 to 57N may be different from each other in consideration of the connection of the one or more DRCs 571 to 57N and the one or more band pass filters 561 to 56N. For example, one or more DRCs 561 to 56N that are connected with the second synthesis unit 551 and with one or more band pass filters 561 to 56N may be different from one or more DRCs 571 to 57N that are connected with the third synthesis unit 553 and with one or more band pass filters 561 to 56N, which are different from the band pass filter that is connected with the second synthesis unit 551.

The fourth synthesis unit 581 may transfer an output signal to the first HPF 591 and the second speaker 595.

The first HPF 591 may be a filter that passes an audio signal corresponding to the second frequency band. For example, the HPF may support a function of passing a higher frequency component than a specific frequency and of blocking a lower frequency component than the specific frequency. The first HPF 591 may receive a signal that is output from the fourth synthesis unit 581 to then output the same through the first speaker 594.

The second speaker 595 may output the audio signal that is received from the fourth synthesis unit 581.

The fifth synthesis unit 583 may transfer an output signal to the second HPF 593 and the third speaker 596.

The second HPF 593 may be a filter that passes an audio signal corresponding to the second frequency band. For example, the HPF may support a function of passing a higher frequency component than a specific frequency and of blocking a lower frequency component than the specific frequency. The second HPF 593 may receive a signal that is output from the fifth synthesis unit 583 to then output the same through the fourth speaker 597.

The third speaker 596 may output the audio signal that is received from the fifth synthesis unit 583.

The specific frequencies (e.g., cut-off frequencies or reference frequencies) of the first HPF 591 and the second HPF 593 may be identical to each other. The specific frequencies (e.g., cut-off frequencies or reference frequencies) of the first HPF 591 and the second HPF 593 may be configured to be different from each other.

The electronic device 101 or 201 may include the first speaker 594 that outputs audio signals of the first frequency band (e.g., a high frequency band), the second speaker 595 that outputs audio signals, and the processor 120 or 210.

Figure 5E:
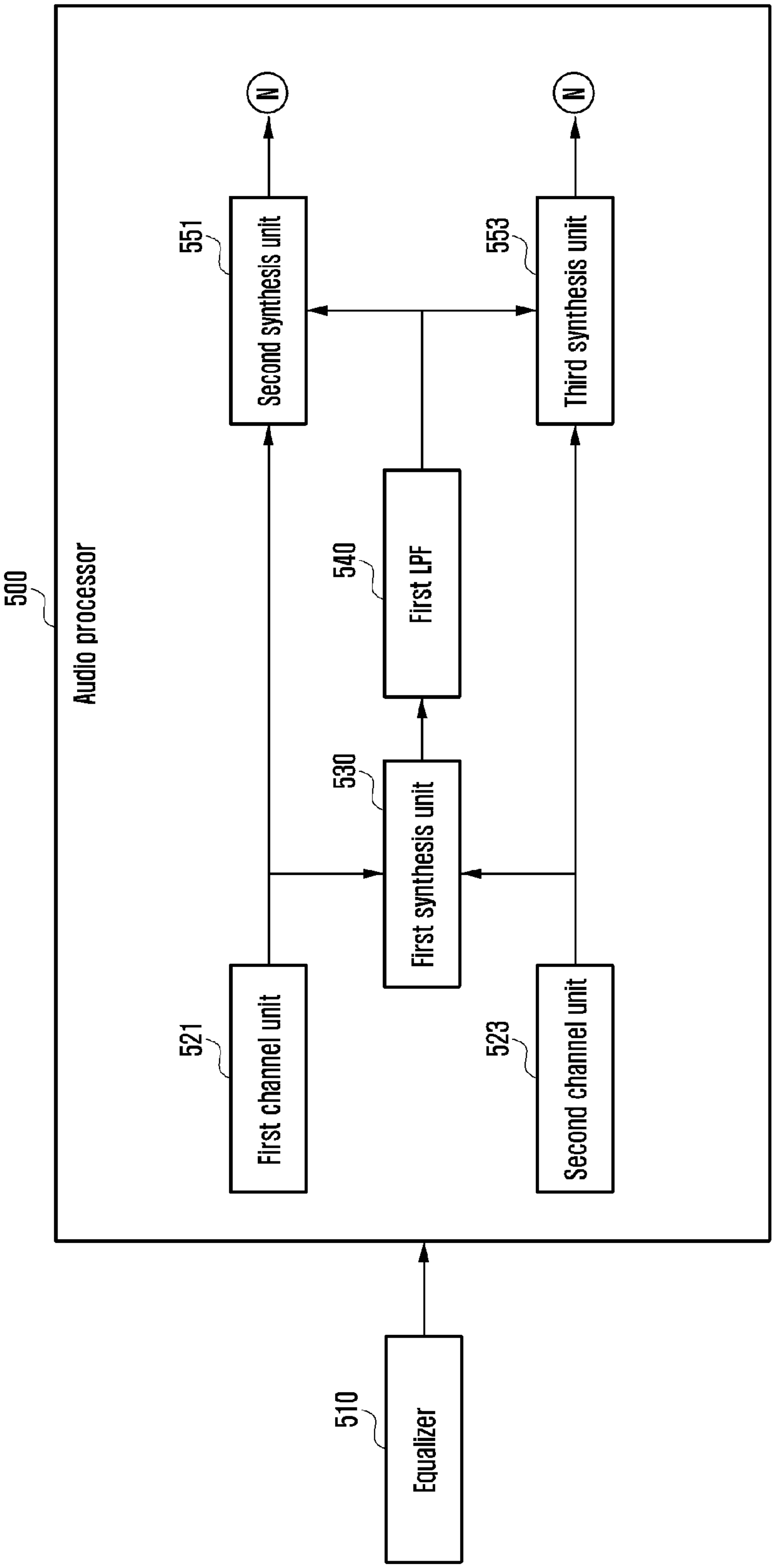
Figure 5F:
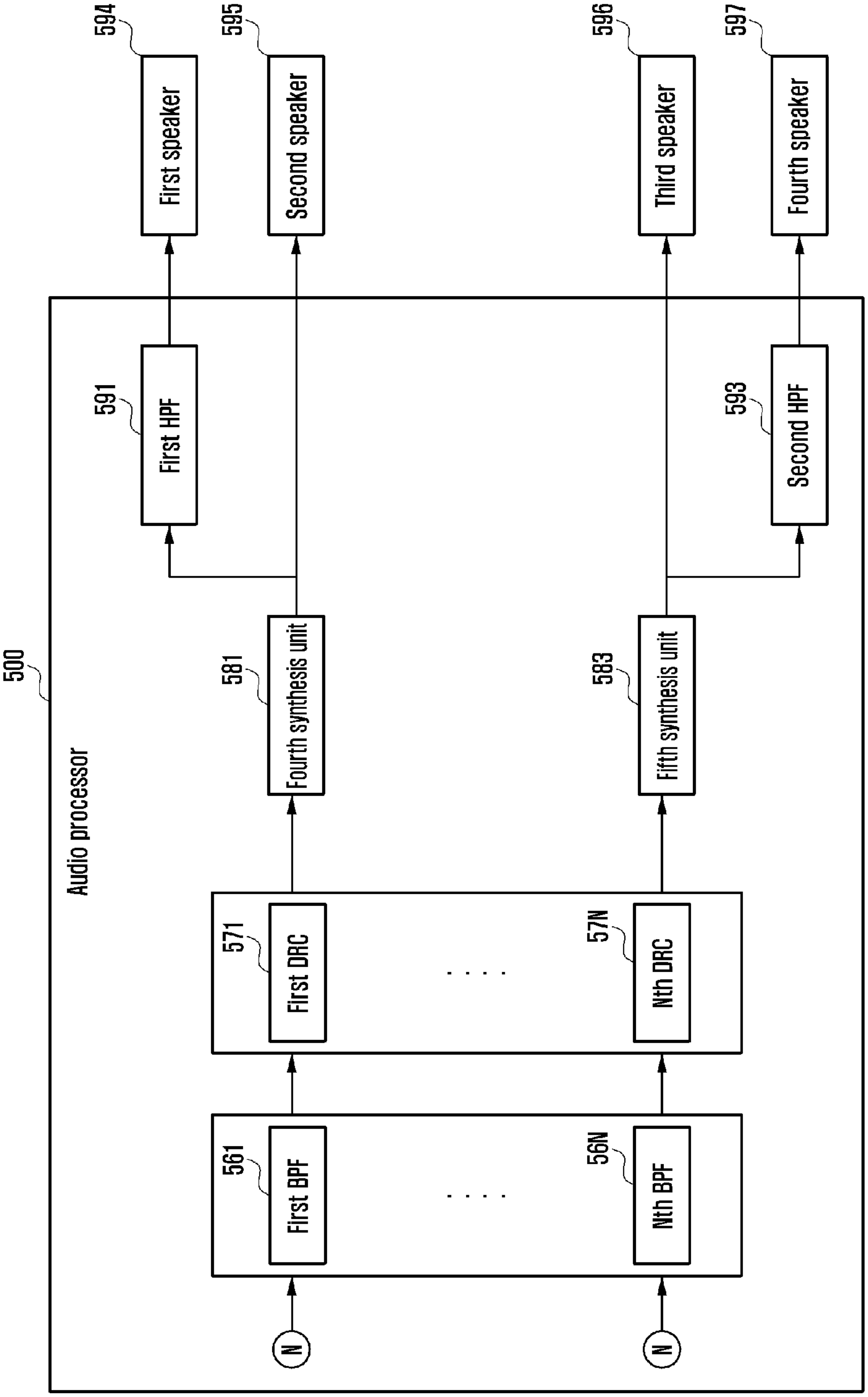

Referring to FIGS. 5E and 5F, the audio processor 500 and an external equalizer 510 are provided. That is, the equalizer 510 of the audio processor 500 may be external to the electronic device 101 or 201. For example, the audio processor 500 may receive an audio signal that has been processed through an external equalizer 510. The description related to the audio processor 500 and the plurality of speakers 594, 595, 596, and 597 is similar to that of FIGS. 5C and 5D, and thus will be omitted here.

FIGS. 6A to 6F are block diagrams of an electronic device for processing audio data, according to an embodiment of the present disclosure.

Figure 6A:
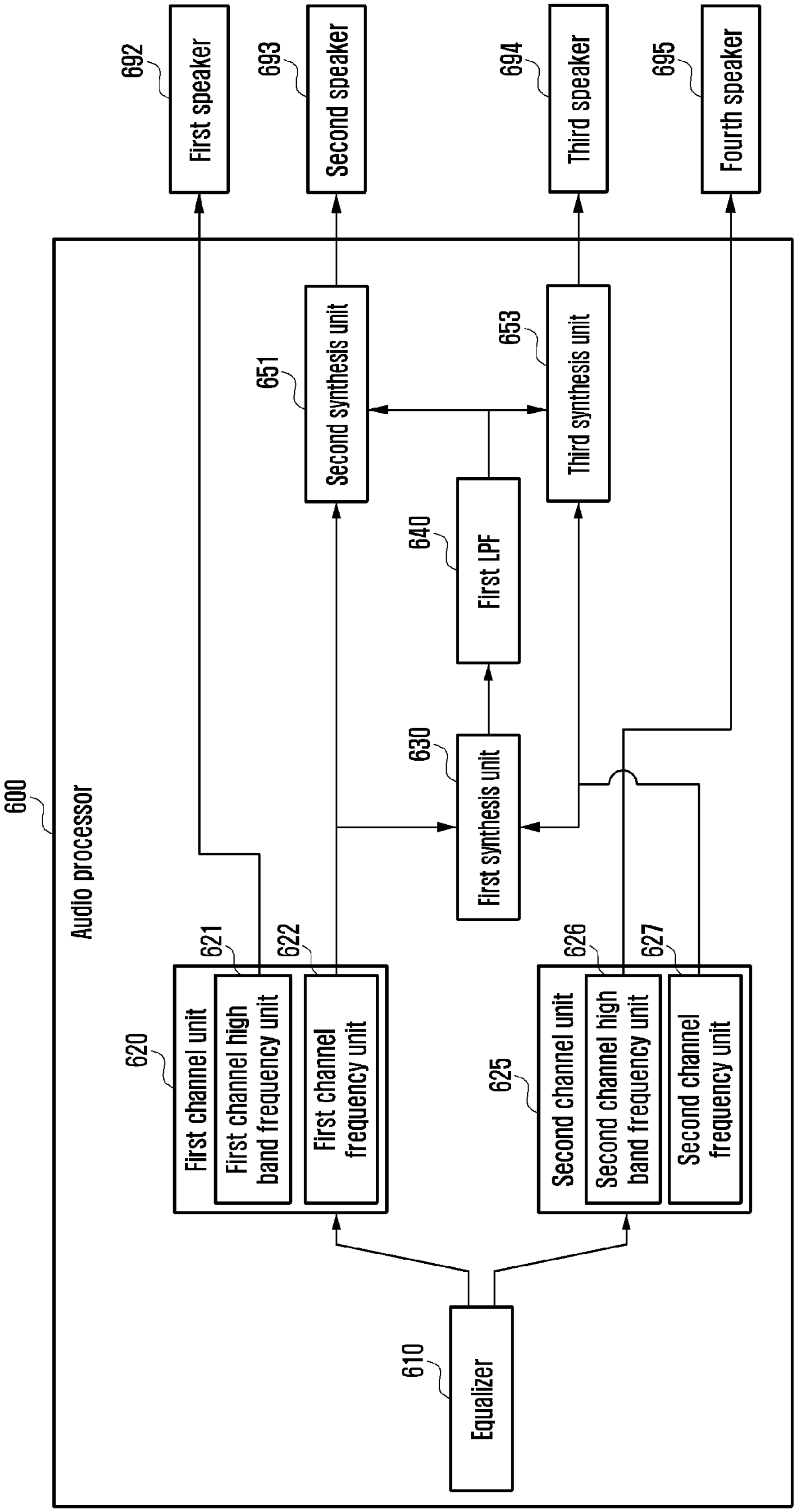
FIGS. 6A to 6F are block diagrams of an electronic device for processing audio data, according to an embodiment of the present disclosure.
Figure 6B:
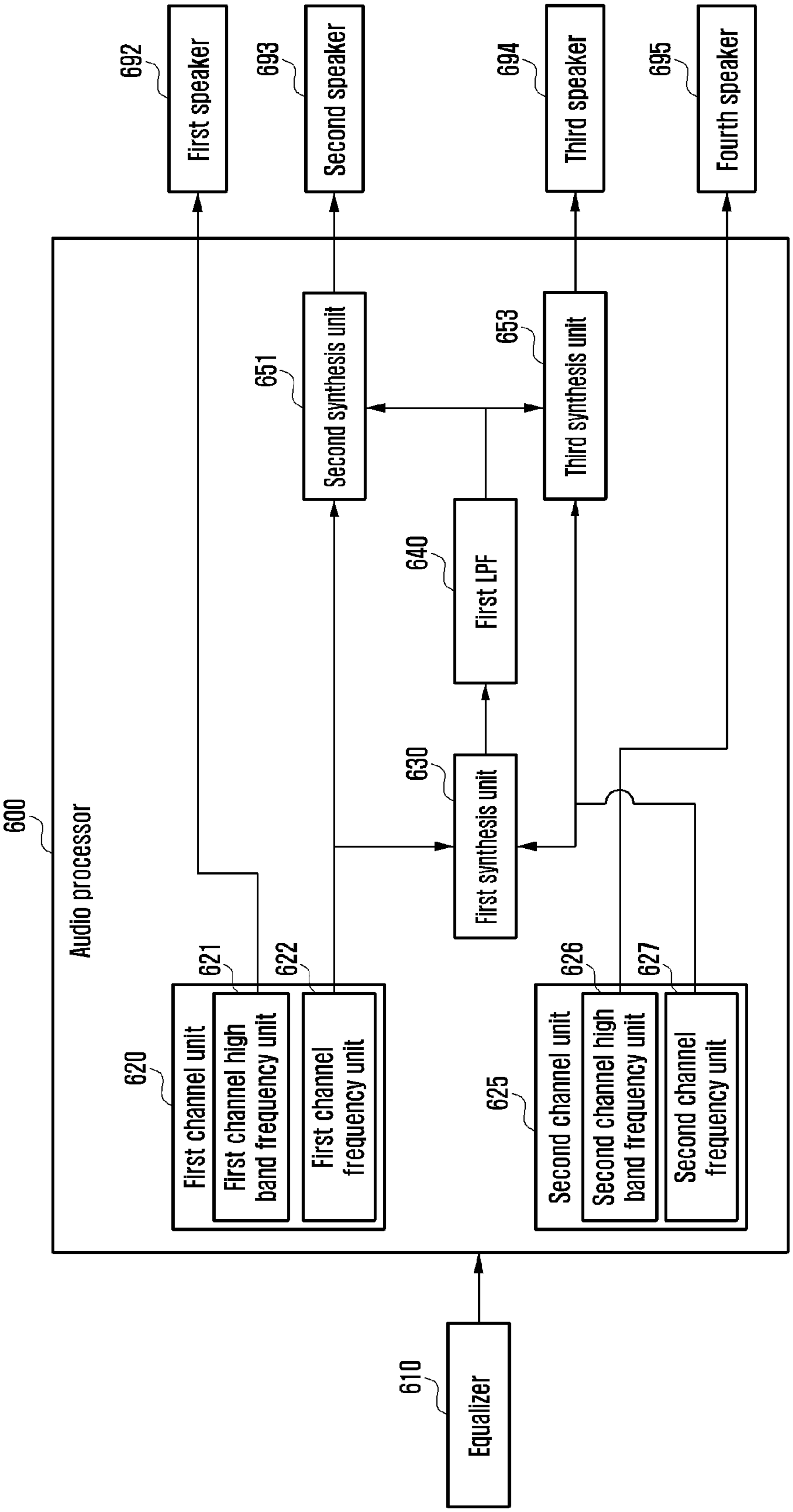

Referring to FIGS. 6A and 6B, an audio processor 600 and a plurality of speakers, such as a first speaker 692, a second speaker 693, a third speaker 694, and a fourth speaker 695 are provided. The audio processor 600 may process an audio signal that is received from the outside to then output the same through the plurality of speakers 692, 693, 694, and 695.

The audio processor 600 may include an equalizer 610. The equalizer 610 may adjust the frequency of an audio signal that is received from the outside. For example, the equalizer 610 may change the frequency characteristic of the received audio signal. As an additional example, the equalizer 610 may be a graphic equalizer that divides the audio signal into several sound levels or a parametric equalizer that freely varies the frequency by means of a boost-cut function.

As shown in FIG. 6B, the equalizer 610 may be external to the electronic device 101 or 201. For example, the audio processor 600 may receive an audio signal that has been processed through an external equalizer 610.

The equalizer 610 may transfer the received audio signal to two channel units 620 and 625, respectively.

Based on at least some of the audio signal the first channel signal and the second channel signal may be obtained. The first channel unit 620 may receive a signal corresponding to the left channel of the audio signal. The second channel unit 625 may receive a signal corresponding to the right channel of the audio signal. For example, in the case of a plurality of speakers, the left channel and the right channel may be channels in which the type of audio signal (e.g., the stereo type of audio signal) to be output to the speaker is separated.

The first channel unit 620 may include the first channel high band frequency unit 621 and the first channel frequency unit 622. The first channel high band frequency unit 621 may extract only the signals that belong to a high band among the received audio signals. The high band may refer to a constant ratio to all of the frequencies of the received audio signals. The first channel high band frequency unit 621 may transfer the audio signal to the first speaker 692. The transferred audio signal may be output through the first speaker 692.

The first channel frequency unit 622 may transfer an audio signal that is received from the equalizer 610 to the first synthesis unit 630 and the second synthesis unit 651.

The second channel unit 625 may include the second channel high band frequency unit 626 and the second channel frequency unit 627. The second channel high band frequency unit 626 may extract only the signals that belong to a high band among the received audio signals. The high band may refer to a constant ratio to all of the frequencies of the received audio signals. The second channel high band frequency unit 626 may transfer the audio signal to the fourth speaker 695. The transferred audio signal may be output through the fourth speaker 695.

The second channel frequency unit 627 may transfer an audio signal that is received from the equalizer 610 to the first synthesis unit 630 and the second synthesis unit 651.

The first synthesis unit 630 may overlap audio signals that are received from the first channel frequency unit 622 and the second channel frequency unit 627 in order to create a synthetic audio signal. The first synthesis unit 630 may transfer the synthetic audio signal to the first LPF 640.

The first LPF 640 may be a filter that passes audio signals corresponding to the first frequency band. For example, the LPF may support a function of passing a frequency component that is lower than a specific frequency and of blocking a frequency component that is higher than the specific frequency. The first LPF 640 may perform the filtering of the synthetic audio signal such that the signal that is lower than a cut-off frequency passes through the same.

The first LPF 640 may transfer the filtered audio signal to the second synthesis unit 651 and the third synthesis unit 653.

The second synthesis unit 651 may overlap audio signals that are received from the first channel frequency unit 622 and the first LPF 640 in order to thereby create a synthetic audio signal. The second synthesis unit 651 may transfer the synthetic audio signal to the second speaker 693. The transferred synthetic audio signal may be output through the second speaker 693. The third synthesis unit 653 may overlap audio signals that are received from the second channel frequency unit 627 and the first LPF 640 in order to thereby create a synthetic audio signal. The third synthesis unit 653 may transfer the synthetic audio signal to the third speaker 694.

Figure 6C:
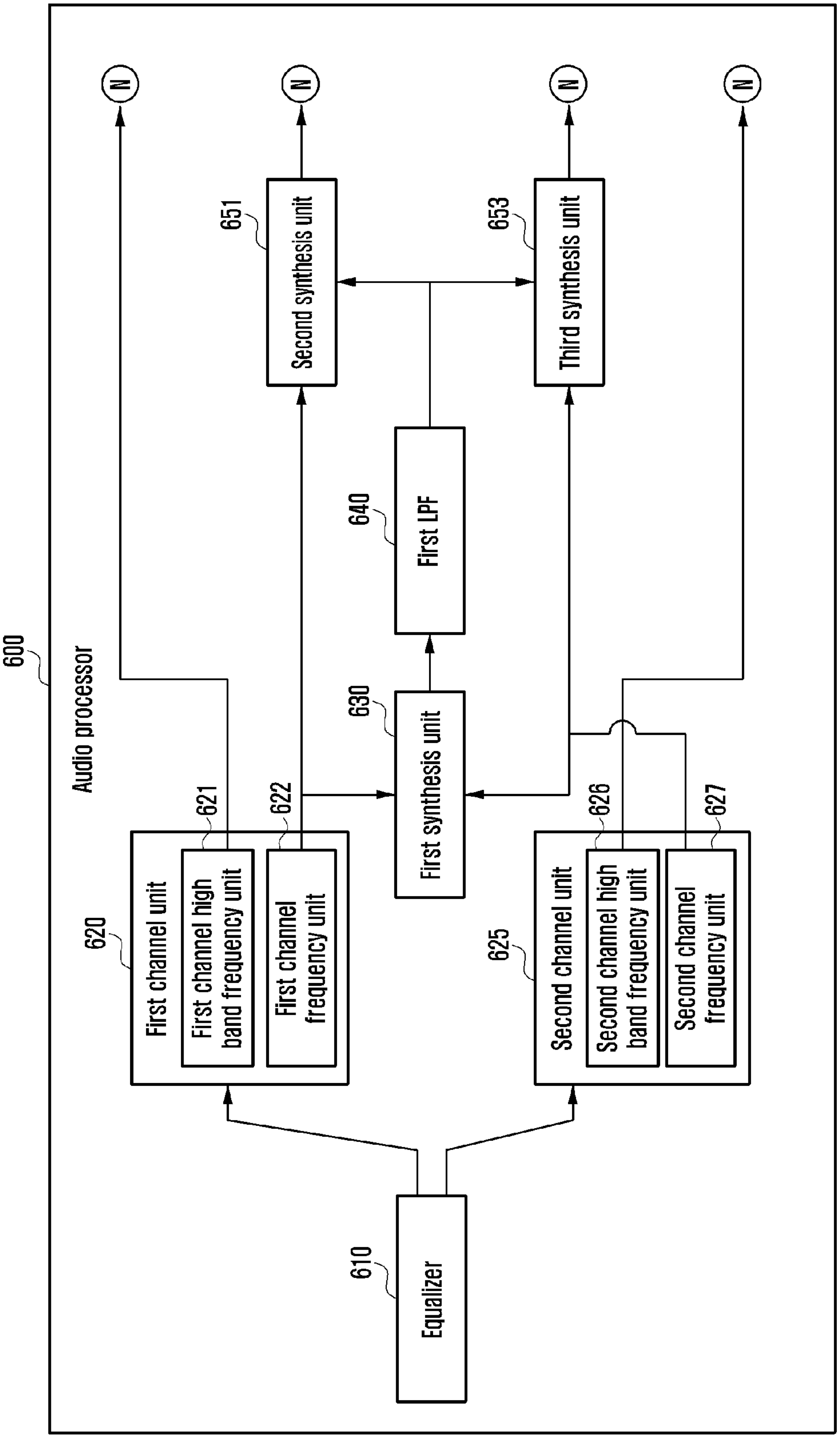
Figure 6D:
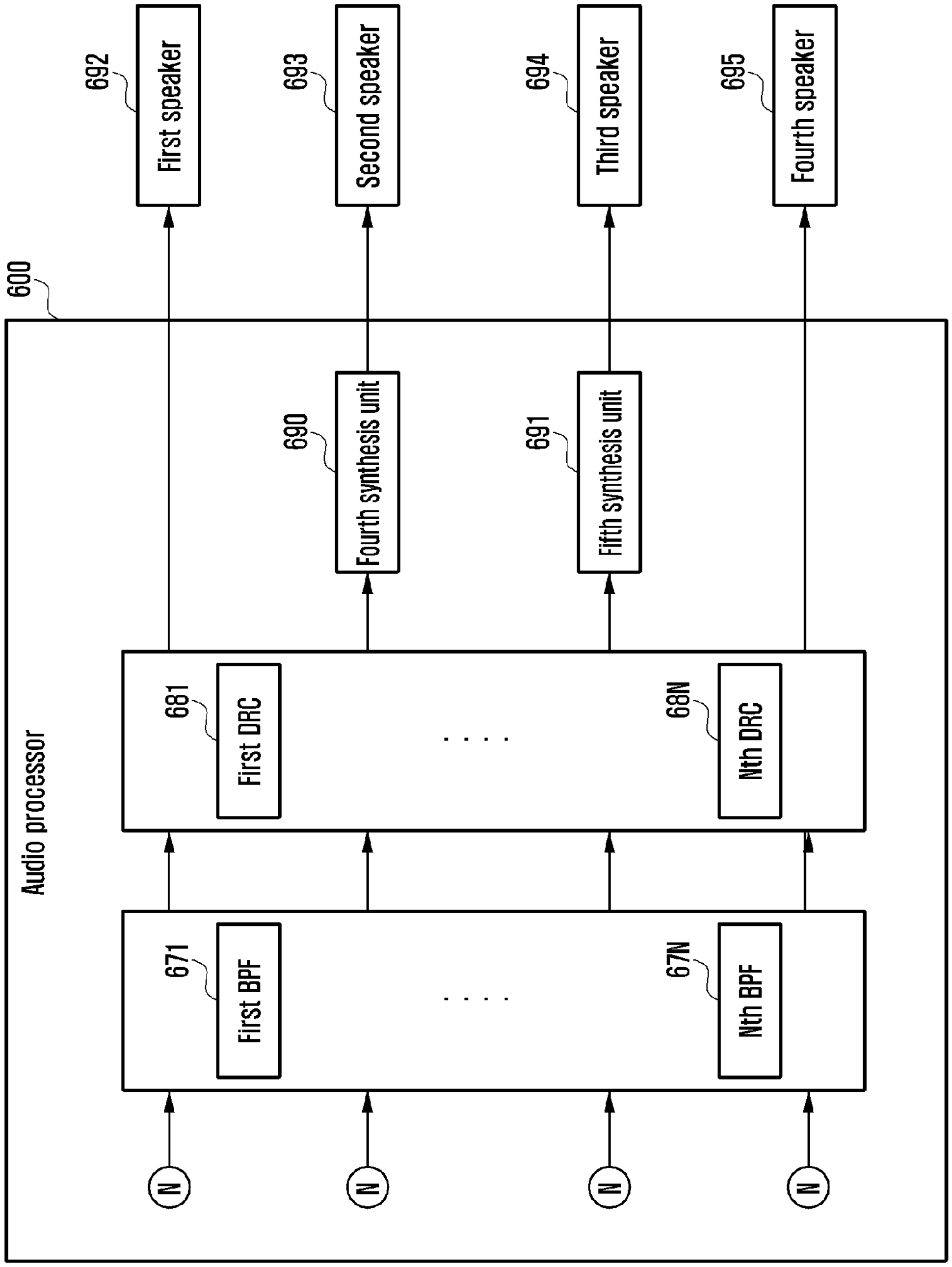

Referring to FIGS. 6C and 6D, the audio processor 600 is provided. The audio processor 600 may process an audio signal that is received from the outside to then be transferred to the plurality of speakers 692, 693, 694, and 695.

The audio processor 600 shown in FIG. 6C includes configurations that are similar to the functions of the equalizer 610, the first channel unit 620, the second channel unit 625, the first synthesis unit 630, and the first LPF 640 of the audio processor 600 shown in FIG. 6A, thus the related description will be omitted.

The first channel unit 620, the second channel unit 625, the second synthesis unit 651, and the third synthesis unit 653 may transfer the created synthetic audio signal to one or more band pass filters 671 to 67N. The band pass filter may be a filter that passes frequencies between the first cut-off frequency and the second cut-off frequency in order to thereby obtain an output.

One or more band pass filters 671~67N may be configured to be separated for each of the first channel unit 620, the second synthesis unit 651, the third synthesis unit 653, and the second channel unit 625. For example, the band pass filter that is connected to the first channel unit 620 may be different from the band pass filter that is connected to the second synthesis unit 651, the third synthesis unit 653, and the second channel unit 625.

Three band pass filters 671 to 67N may be connected to each synthesis unit (the second synthesis unit 651 and the third synthesis unit 653). For example, three band pass filters may pass signals corresponding to a low band frequency, a medium band frequency, and a high band frequency, respectively, with respect to the synthetic audio signal that is received from the second synthesis unit 651. Another three band pass filters may pass signals corresponding to a low band frequency, a medium band frequency, and a high band frequency, respectively, with respect to the synthetic audio signal that is received from the third synthesis unit 653. The low band, the medium band, and the high band are relative concepts, and may be determined according to a ratio to the overall received frequencies. Alternatively, each cut-off frequency value may be specified or changed in advance.

One or more band pass filters 671 to 67N may pass an audio signal between specific frequencies to then be transferred to one or more DRCs 681 to 68N. The DRC may be intended to remove noise of the audio signal. For example, the DRC may correct the output distortion of the audio signal, and may compensate for the amplitude.

One or more DRCs 681 to 68N may be configured based on the number of band pass filters 671 to 67N or the band pass filters that are separated by the synthesis units (the second synthesis unit 651 and the third synthesis unit 653). For example, in the case where four band pass filters 671 to 67N are configured with respect to each synthesis unit (the second synthesis unit 651 or the third synthesis unit 653), four DRCs 681 to 68N may be configured as well. As another example, in the case where the band pass filter that is connected to the second synthesis unit 651 is different from the band pass filter that is connected to the third synthesis unit 653, different DRCs 681 to 68N may be connected to the separated band pass filters, respectively.

One or more DRCs 681 to 68N may transfer an output signal to the fourth synthesis unit 690 and the fifth synthesis unit 691. The audio signals that are received by the fourth synthesis unit 690 and the fifth synthesis unit 691 from one or more DRCs 681 to 68N may be different from each other in consideration of the connection of the one or more DRCs 681 to 68N and the one or more band pass filters 671 to 67N. For example, one or more DRCs 681 to 68N that are connected with the second synthesis unit 651 and with one or more band pass filters 671 to 67N may be different from one or more DRCs 681 to 68N that are connected with the third synthesis unit 653 and with one or more band pass filters 671 to 67N, which are different from the band pass filter that is connected with the second synthesis unit 651.

The DRC may remove noise of the audio signal. For example, the DRC may correct the output distortion of the audio signal, and may compensate for the amplitude.

The fourth synthesis unit 690 may create a synthetic audio signal. The fourth synthesis unit 690 may transfer the synthetic audio signal to the second speaker 693.

The fifth synthesis unit 691 may create a synthetic audio signal. The fifth synthesis unit 691 may transfer the synthetic audio signal to the third speaker 694.

The second speaker 693 may output the synthetic audio signal that is received from the fourth synthesis unit 690.

The third speaker 694 may output the synthetic audio signal that is received from the fifth synthesis unit 691.

Figure 6E:
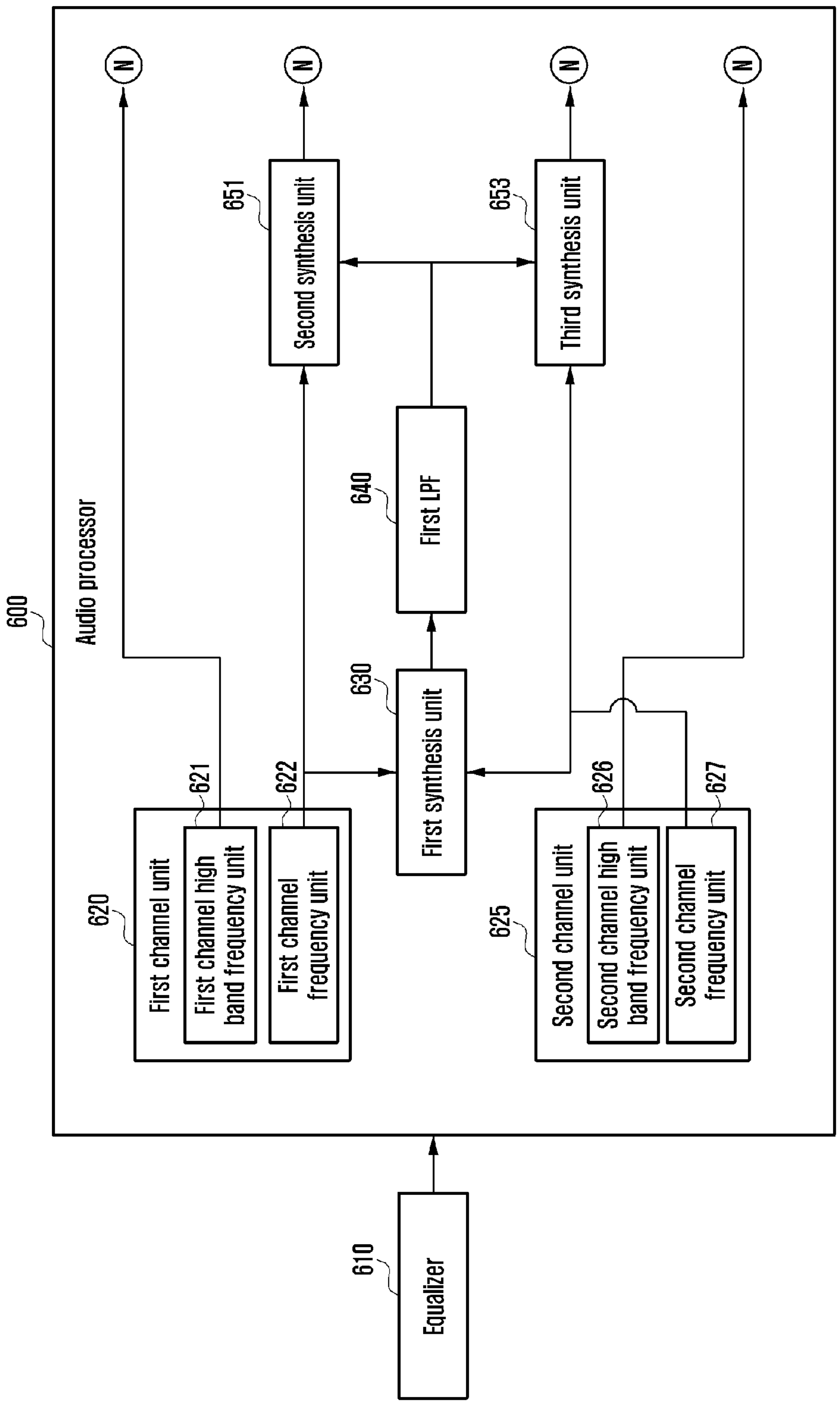
Figure 6F:
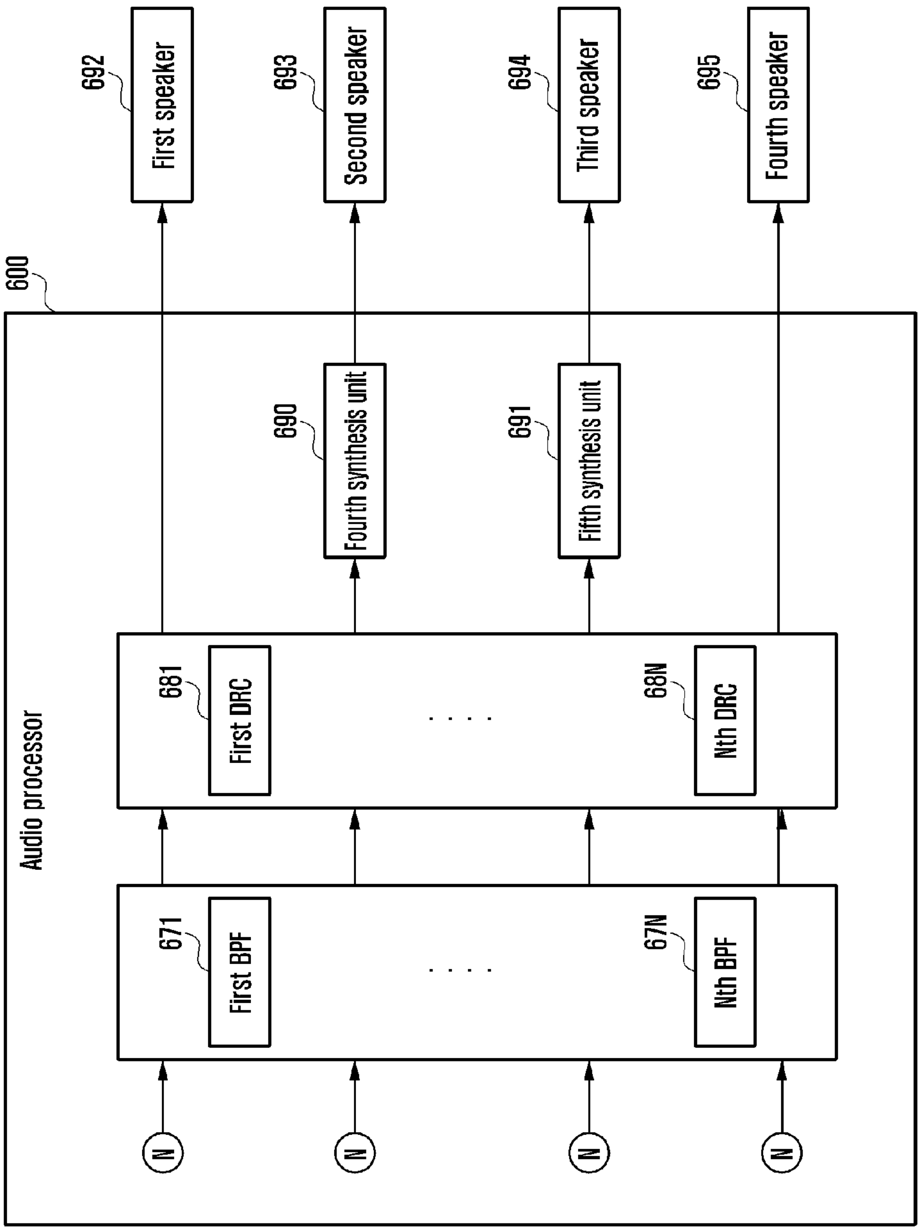

Referring to FIGS. 6E and 6F, the audio processor 600 and an external equalizer 610 are provided. That is, the equalizer 610 may be external to the electronic device 101 or 201. For example, the audio processor 600 may receive an audio signal that has been processed through an external equalizer 610. The description related to the audio processor 600 and the plurality of speakers 692, 693, 694, and 695 is similar to that of FIGS. 6C and 6D, and thus will be omitted here.

The electronic device, according to an embodiment of the present disclosure, may include a first speaker, a second speaker, and an audio processor. The audio processor may be configured to create, from an audio signal, the first frequency audio signal corresponding to the first frequency band by using a low pass filter (LPF), synthesize the created first frequency audio signal and the audio signal in order to thereby create a synthetic audio signal, create, from the synthetic audio signal, the second frequency audio signal corresponding to the second frequency band by using a high pass filter (HPF), output the created second frequency audio signal through the first speaker; and output the created synthetic audio signal through the second speaker.

The electronic device, according to an embodiment of the present disclosure, may include, a first speaker that is configured to output an audio signal of the first frequency band, a second speaker that is configured to output an audio signal; and a processor. The processor may be configured to synthesize at least some of the first audio signal of the second frequency band corresponding to the first channel of the audio signal and the second audio signal corresponding to the second channel of the audio signal in order to thereby create the third audio signal, output the third audio signal through the second speaker, and output, through the first speaker, the fourth audio signal corresponding to the first frequency band among the third audio signal by using a filter that passes the first frequency band.

Figure 7:
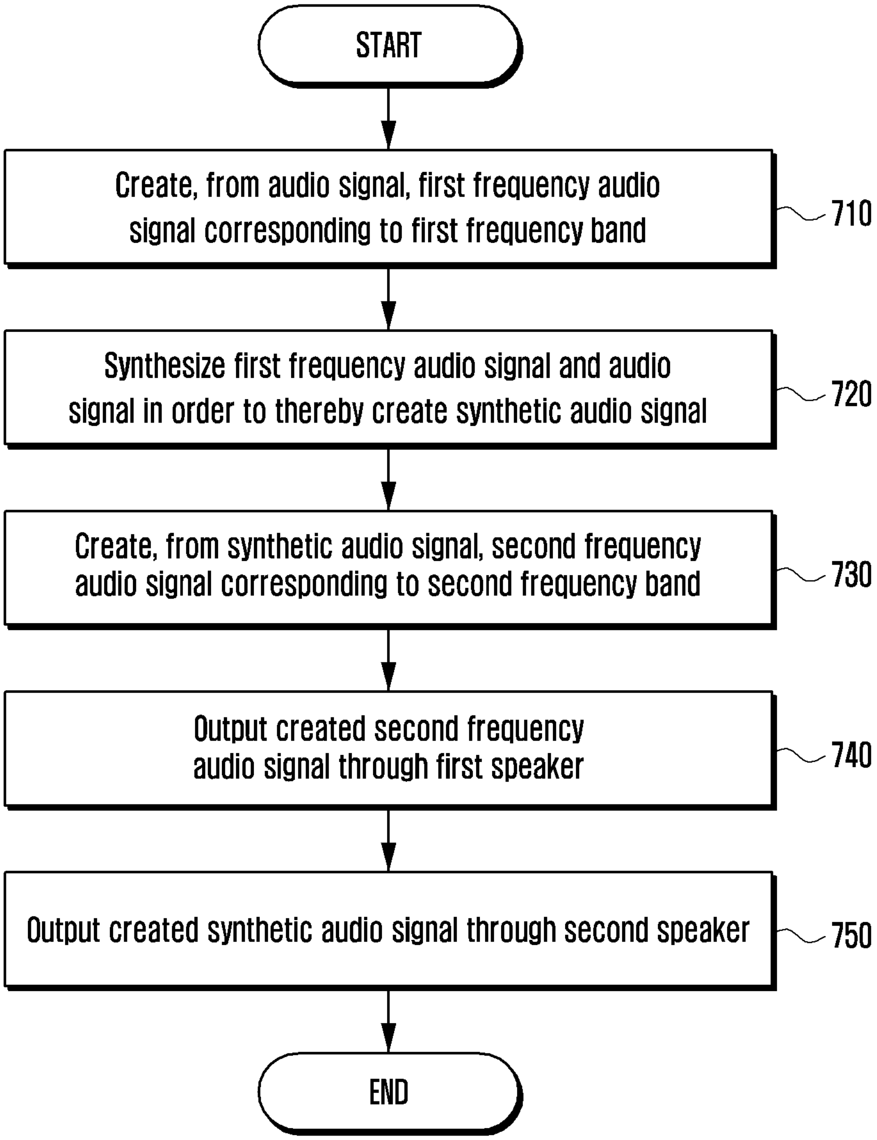
FIG. 7 is a flowchart of a method for processing audio data in an electronic device, according to an embodiment of the present disclosure.

FIG. 7 is a flowchart of a method for processing audio data in an electronic device, according to an embodiment of the present disclosure.

Referring to FIG. 7, the electronic device, according to an embodiment of the present disclosure, may be the electronic device 101 or the processor 120 shown in FIG. 1, the electronic device 201 or the processor 201 shown in FIG. 2, or an independent module to support the function of the audio processor 400, 500, or 600 shown in FIGS. 4A to 6D. The electronic device, may obtain an audio signal from an external device by using the communication module 220. The electronic device may obtain the audio signal through the equalizer 510.

In step 710, the audio processor 500 of the electronic device 101 may create the first frequency audio signal corresponding to the first frequency band from the audio signal. The first frequency band may be a low band. The low band may be lower than a cut-off frequency that is relatively low compared to all of the frequencies.

In step 720, the audio processor 500 may synthesize the first frequency audio signal and the audio signal above in order to create a synthetic audio signal.

The audio processor 500 may obtain the first channel signal and the second channel signal based on at least some of the audio signal. The first channel signal and the second channel signal may correspond to the left signal and the right signal, respectively, in the stereo type of audio signal. The audio processor 500 may create, from the second channel signal, the second bass signal corresponding to the first frequency band by using a low pass filter. The audio processor 500 may synthesize the second bass signal and the first channel signal in order to thereby create a synthetic audio signal.

The audio processor 500 may obtain the first channel signal the second channel signal based on at least some of the audio signal. The electronic device may synthesize the first channel signal and the second channel signal in order to thereby create a synthetic audio signal. The audio processor 500 may create, from the synthetic channel audio signal, a synthetic bass signal by using a low pass filter. The audio processor 500 may synthesize the synthetic bass signal and the first channel signal or the second channel signal in order to thereby create the synthetic audio signal.

In step 730, the audio processor 500 may create, from the synthetic audio signal, the second frequency audio signal corresponding to the second frequency band. The second frequency band may be a high band. The high band may be higher than a cut-off frequency that is relatively high compared to all of the frequencies.

The audio processor 500 may filter the created synthetic audio signal into different frequency bands through a plurality of band pass filters (BPFs). The audio processor 500 may remove, through a plurality of dynamic range controls (DRCs), noise of the signal created by the filtering, and may transfer the noise-removed signal to the high pass filter and the second speaker, respectively.

In step 740, the audio processor 500 may output the second frequency audio signal through the first speaker 594. The audio processor 500 may output, through the first speaker 594, the audio signal that has passed through the band pass filter, the dynamic range control, and the high pass filter.

In step 750, the audio processor 500 may output the created synthetic audio signal through the second speaker 595. The audio processor 500 may output, through the second speaker 595, the signal that has passed through the band pass filter and the dynamic range control.

Figure 8:
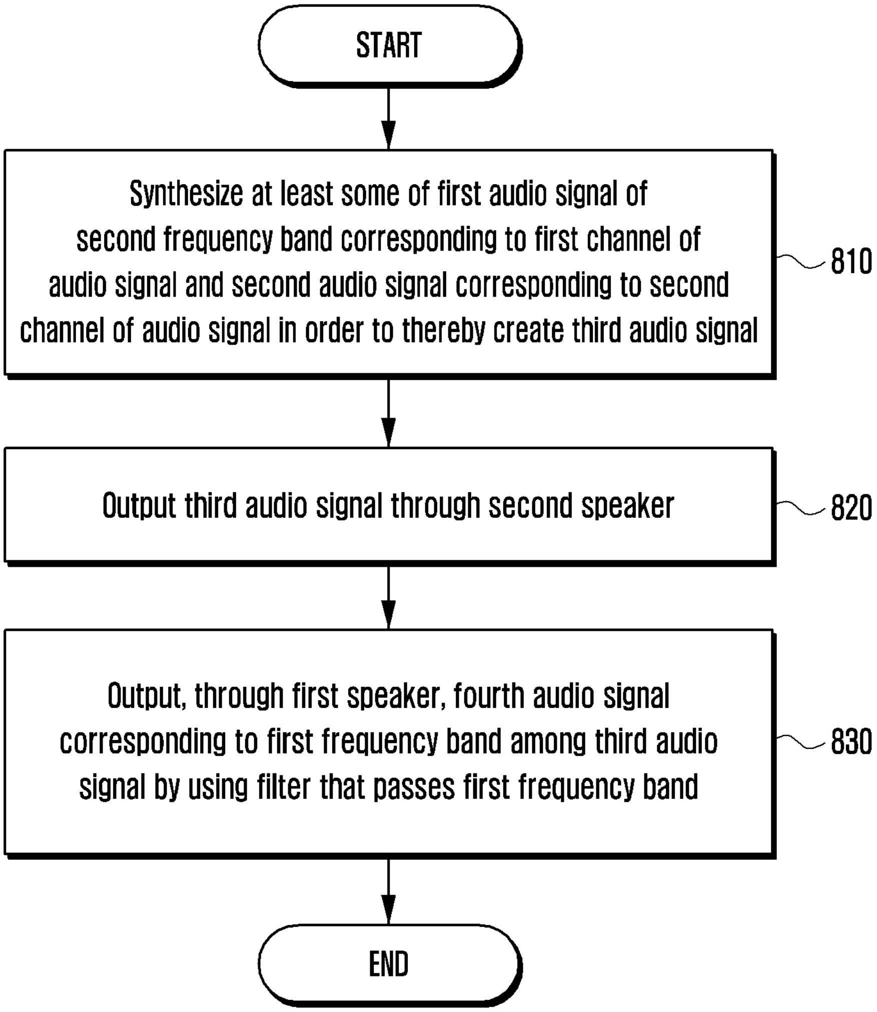
FIG. 8 is a flowchart of a method for processing audio data in an electronic device, according to an embodiment of the present disclosure.

FIG. 8 is a flowchart of a method for processing audio data in an electronic device, according to an embodiment of the present disclosure.

Referring to FIG. 8, the electronic device, according to an embodiment of the present disclosure, may be the electronic device 101 or the processor 120 shown in FIG. 1, the electronic device 201 or the processor 201 shown in FIG. 2, or an independent module to support the function of the audio processor 400, 500, or 600 shown in FIGS. 4A to 6D.

In step 810, the audio processor 500 of the electronic device 101 may synthesize at least some of the first audio signal of the second frequency band (e.g., a low frequency band) corresponding to the first channel unit 521 (e.g., the left channel) of the audio signal and the second audio signal corresponding to the second channel unit 523 (e.g., the right channel) of the audio signal in order to thereby create the third audio signal.

In step 820, the audio processor 500 may output the third audio signal through the second speaker 595.

In step 830, the audio processor 500 may output, through the first speaker 594, the fourth audio signal corresponding to the first frequency band among the third audio signal by using a filter that passes the first frequency band (e.g., a high frequency band).

The audio processor 500 may synthesize at least some of the third audio signal of the second frequency band (e.g., a low frequency band) corresponding to the second channel unit 523 (e.g., the right channel) and the fourth audio signal corresponding to the first channel unit 521 (e.g., the left channel) in order to thereby create the fifth audio signal.

The audio processor 500 may output the fifth audio signal through the third speaker 596.

The audio processor 500 may output, through the fourth speaker 597, the sixth audio signal corresponding to the first frequency band (e.g., a high frequency band) among the fifth audio signal by using a filter that passes the first frequency band (e.g., a high frequency band).

A method for outputting an audio signal in an electronic device, according to an embodiment of the present disclosure, may include creating, from an audio signal, a first frequency audio signal corresponding to a first frequency band by using a low pass filter (LPF), synthesizing the created first frequency audio signal and the audio signal in order to create a synthetic audio signal, creating, from the synthetic audio signal, a second frequency audio signal corresponding to a second frequency band by using a high pass filter (HPF), outputting the created second frequency audio signal through a first speaker, and outputting the created synthetic audio signal through a second speaker.

A method for outputting an audio signal in an electronic device, according to an embodiment of the present disclosure, may include synthesizing at least some of the first audio signal of the second frequency band corresponding to the first channel of the audio signal and the second audio signal corresponding to the second channel of the audio signal in order to thereby create the third audio signal, outputting the third audio signal through the second speaker, and outputting, through the first speaker, the fourth audio signal corresponding to the first frequency band among the third audio signal by using a filter that passes the first frequency band.

According to an embodiment, at least some of the devices (for example, modules or functions thereof) or the method (for example, steps) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable storage medium may be the memory 130.

While the present disclosure has been shown and described with reference to an embodiment thereof, it will be understood by those skilled in the art that various changes in form and details may be made therein without departing from the spirit and scope of the present disclosure. Accordingly, the scope of the present disclosure is defined, not by the detailed description and embodiments, but by the appended claims and their equivalents.

What is claimed is:

1. An electronic device comprising:
a first speaker;
a second speaker; and
an audio processor that:
  creates, from an audio signal, a first frequency audio signal corresponding to a first frequency band by using a low pass filter;
  synthesizes the created first frequency audio signal and the audio signal to create a synthetic audio signal;
  creates, from the synthetic audio signal, a second frequency audio signal corresponding to a second frequency band by using a high pass filter;
  outputs the created second frequency audio signal through the first speaker; and
  outputs the created synthetic audio signal through the second speaker.

2. The electronic device according to claim 1, wherein the audio processor:
obtains a first channel signal and a second channel signal based on at least some of the audio signal;
creates, from the second channel signal, a second bass signal corresponding to the first frequency band by using the low pass filter; and
synthesizes the second bass signal and the first channel signal to create the synthetic audio signal.

3. The electronic device according to claim 1, wherein the audio processor:
obtains a first channel signal and a second channel signal based on at least some of the audio signal;
synthesizes the first channel signal and the second channel signal to create a synthetic channel audio signal;
creates, from the synthetic channel audio signal, a synthetic bass signal by using the low pass filter; and
synthesizes the synthetic bass signal and the first channel signal or the second channel signal to create the synthetic audio signal.

4. The electronic device according to claim 1, further comprising:

a communication module; and a processor that obtains the audio signal from an external device by using the communication module.

5. The electronic device according to claim 1, further comprising an equalizer, wherein the audio processor obtains the audio signal through the equalizer.

6. The electronic device according to claim 1, further comprising:

one or more band pass filters that filter the created synthetic audio signal into different frequency bands, respectively; and one or more dynamic range controls that remove noise of the filtered signal, and transfer the noise-removed signal to the high pass filter and the second speaker, respectively.

7. A device comprising:

a first speaker that outputs an audio signal of a first frequency band;

a second speaker that outputs the audio signal; and a processor that:

synthesizes at least some of a first audio signal of a second frequency band corresponding to a first channel of the audio signal and a second audio signal corresponding to a second channel of the audio signal to create a third audio signal;

outputs, through the second speaker, the third audio signal; and outputs, through the first speaker, a fourth audio signal corresponding to the first frequency band among the third audio signal by using a filter that passes the first frequency band.

8. The device according to claim 7, wherein the processor:

synthesizes at least some of the third audio signal of the second frequency band corresponding to the second channel and the fourth audio signal corresponding to the first channel to create a fifth audio signal;

outputs, through a third speaker, the fifth audio signal; and outputs, through a fourth speaker, a sixth audio signal corresponding to the first frequency band among the fifth audio signal by using a filter that passes the first frequency band.

9. A method for outputting an audio signal in an electronic device, the method comprising:

creating, from an audio signal, a first frequency audio signal corresponding to a first frequency band by using a low pass filter;

synthesizing the created first frequency audio signal and the audio signal to create a synthetic audio signal;

creating, from the synthetic audio signal, a second frequency audio signal corresponding to a second frequency band by using a high pass filter;

outputting the created second frequency audio signal through a first speaker; and outputting the created synthetic audio signal through a second speaker.

10. The method according to claim 9, wherein creating the synthetic audio signal comprises:

obtaining a first channel signal and a second channel signal based on at least some of the audio signal;

creating, from the second channel signal, a second bass signal corresponding to the first frequency band by using the low pass filter; and synthesizing the second bass signal and the first channel signal to create the synthetic audio signal.

11. The method according to claim 9, wherein creating the synthetic audio signal comprises:

obtaining a first channel signal and a second channel signal based on at least some of the audio signal;

synthesizing the first channel signal and the second channel signal to create a synthetic channel audio signal;

creating, from the synthetic channel audio signal, a synthetic bass signal by using the low pass filter; and synthesizing the synthetic bass signal and the first channel signal or the second channel signal to create the synthetic audio signal.

12. The method according to claim 9, wherein the audio signal is obtained from an external device by using a communication module.

13. The method according to claim 9, wherein the audio signal is obtained through an equalizer.

14. The method according to claim 9, further comprising:

filtering the created synthetic audio signal into different frequency bands, respectively, by using one or more band pass filters; and removing noise of the filtered signal and transferring the noise-removed signal to the high pass filter and the second speaker, respectively, by using one or more dynamic range controls.

* * * * *